United States Patent
Douglass et al.

(10) Patent No.: US 9,989,579 B2
(45) Date of Patent: Jun. 5, 2018

(54) MONITORING SYSTEMS AND METHODS FOR DETECTING THERMAL-MECHANICAL STRAIN FATIGUE IN AN ELECTRICAL FUSE

(71) Applicant: COOPER TECHNOLOGIES COMPANY, Houston, TX (US)

(72) Inventors: Robert Stephen Douglass, Wildwood, MO (US); Ramdev Kanapady, Campbell, CA (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 0 days. days.

(21) Appl. No.: 15/186,865

(22) Filed: Jun. 20, 2016

(65) Prior Publication Data
US 2017/0363674 A1  Dec. 21, 2017

(51) Int. Cl.
| G01R 31/07 | (2006.01) |
| H01H 85/17 | (2006.01) |
| H01H 85/08 | (2006.01) |

(52) U.S. Cl.
CPC ............ *G01R 31/07* (2013.01); *H01H 85/08* (2013.01); *H01H 85/17* (2013.01)

(58) Field of Classification Search
None
See application file for complete search history.

(56) References Cited

U.S. PATENT DOCUMENTS

| 4,741,692 A | * | 5/1988 | Sadakata | .................. F23Q 7/001 123/145 A |
| 4,869,972 A | | 9/1989 | Hatagishi | |
| 4,998,086 A | * | 3/1991 | Kourinsky | ............. H01H 69/02 337/255 |
| 5,237,875 A | * | 8/1993 | de la Veaux | ........... G01N 3/062 73/775 |
| 5,453,696 A | * | 9/1995 | Becker | ................... G11C 29/02 324/550 |
| 5,520,055 A | * | 5/1996 | Fussinger | ........... G01M 5/0033 73/762 |

(Continued)

FOREIGN PATENT DOCUMENTS

| DE | 102012209138 A1 | 12/2013 |
| DE | 102012224223 A1 | 7/2014 |

(Continued)

OTHER PUBLICATIONS

International Search Report and Written Opinion for International Application No. PCT/US2017/029763, dated Jul. 27, 2017, 15 pages.

(Continued)

*Primary Examiner* — Quan-Zhen Wang
*Assistant Examiner* — Chico A Foxx
(74) *Attorney, Agent, or Firm* — Armstrong Teasdale LLP

(57) ABSTRACT

Systems and methods for detecting thermal-mechanical strain fatigue in an electrical fuse include a controller configured to monitor at least one fuse fatigue parameter over a period of time while the fuse is connected to an energized electrical power system, and based on the monitored at least one fuse fatigue parameter, the controller is further configured to determine at least one of a consumed service life of the fuse element or a service life remaining of the fuse element.

19 Claims, 10 Drawing Sheets

(56) References Cited

U.S. PATENT DOCUMENTS

| | | | | |
|---|---|---|---|---|
| 6,664,000 | B1* | 12/2003 | Sonobe | H01M 2/34 429/100 |
| 9,006,794 | B1* | 4/2015 | Xie | H01L 23/5256 257/202 |
| 2005/0258944 | A1* | 11/2005 | Ozawa | B60R 25/2036 340/426.1 |
| 2008/0174928 | A1* | 7/2008 | Liu | H02H 6/00 361/93.1 |
| 2008/0297303 | A1* | 12/2008 | Tabatowski-Bush | B60L 3/04 338/220 |
| 2009/0256235 | A1* | 10/2009 | Takaoka | H01L 23/5256 257/529 |
| 2010/0164677 | A1 | 7/2010 | Yang | |
| 2010/0188187 | A1* | 7/2010 | Mughal | H01H 85/24 337/225 |
| 2014/0087600 | A1* | 3/2014 | Von Zur Muehlen | H01H 85/48 439/830 |
| 2014/0209692 | A1* | 7/2014 | Ozaki | G06K 19/0717 235/492 |
| 2014/0300183 | A1* | 10/2014 | Trathnigg | B60L 3/003 307/10.1 |
| 2014/0353796 | A1* | 12/2014 | Lavoie | H01L 28/00 257/529 |
| 2015/0009008 | A1* | 1/2015 | Luna | H01H 85/10 337/295 |
| 2015/0151740 | A1* | 6/2015 | Hynes | B60W 50/0205 701/29.2 |
| 2015/0348732 | A1* | 12/2015 | Douglass | H01H 85/203 337/198 |
| 2015/0348791 | A1 | 12/2015 | Douglass et al. | |
| 2015/0357144 | A1* | 12/2015 | Pal | H01H 85/48 337/227 |
| 2016/0299186 | A1* | 10/2016 | Fan | G01R 31/07 |
| 2016/0330216 | A1* | 11/2016 | Kishinevsky | H04L 63/1441 |
| 2017/0023618 | A1* | 1/2017 | Douglass | G01R 15/146 |
| 2017/0047758 | A1* | 2/2017 | Chatroux | H02M 1/36 |
| 2017/0179548 | A1* | 6/2017 | Lee | H01H 69/02 |
| 2017/0199248 | A1* | 7/2017 | Lee | G01R 31/3651 |

FOREIGN PATENT DOCUMENTS

| | | |
|---|---|---|
| DE | 102016106361 A1 | 10/2016 |
| EP | 0962953 A2 | 12/1999 |
| EP | 2608243 A1 | 6/2013 |
| WO | 0131311 A2 | 5/2001 |
| WO | 2015183805 A1 | 12/2015 |

OTHER PUBLICATIONS

International Search Report and Written Opinion for International Application No. PCT/US2017/029774, dated Jul. 21, 2017, 16 pages.

* cited by examiner

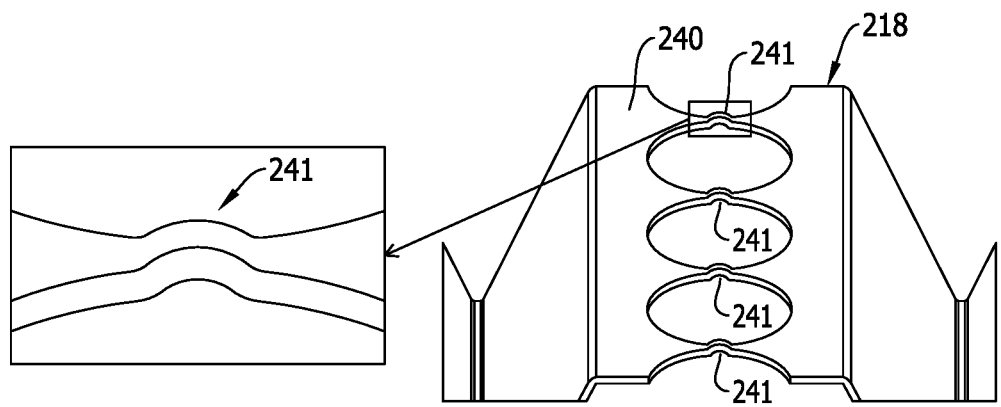
FIG. 6
FIG. 5
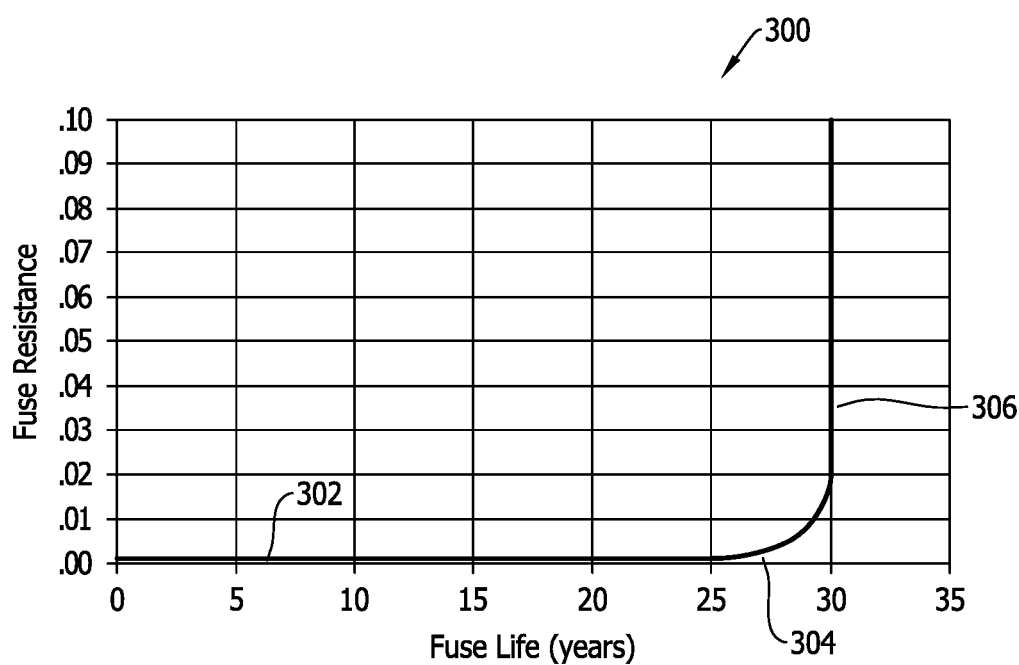
FIG. 7

MONITORING SYSTEMS AND METHODS FOR DETECTING THERMAL-MECHANICAL STRAIN FATIGUE IN AN ELECTRICAL FUSE

CROSS REFERENCE TO RELATED APPLICATIONS

This application relates in part to subject matter described in U.S. application Ser. No. 14/289,032 filed May 28, 2014 and U.S. application Ser. No. 14/803,315 filed Jul. 20, 2015, the complete disclosures of which are hereby incorporated by reference in its entirety.

BACKGROUND OF THE INVENTION

The field of the invention relates generally to systems and methods of sensing and monitoring electrical current flow through a conductor having a non-linear resistance in an electrical power system, and more specifically to sensing and monitoring systems for detecting thermal-mechanical strain fatigue in an electrical fuse protecting an electrical circuit.

Fuses are widely used as overcurrent protection devices to prevent costly damage to electrical circuits. Fuse terminals typically form an electrical connection between an electrical power source or power supply and an electrical component or a combination of components arranged in an electrical circuit. One or more fusible links or elements, or a fuse element assembly, is connected between the fuse terminals, so that when electrical current flow through the fuse exceeds a predetermined limit, the fusible elements melt and open one or more circuits through the fuse to prevent electrical component damage.

So-called full-range power fuses are operable in high voltage power distributions to safely interrupt both relatively high fault currents and relatively low fault currents with equal effectiveness. In view of constantly expanding variations of electrical power systems, known fuses of this type are disadvantaged in some aspects. Improvements in full-range power fuses are desired to meet the needs of the marketplace.

BRIEF DESCRIPTION OF THE DRAWINGS

Non-limiting and non-exhaustive embodiments are described with reference to the following Figures, wherein like reference numerals refer to like parts throughout the various drawings unless otherwise specified.

FIG. 5 shows a portion of the fuse element assembly shown in FIG. 4.

FIG. 6 is a magnified view of a portion of FIG. 4 in a fatigued state.

FIG. 7 is an exemplary fuse resistance versus time plot illustrating a typical fuse progressing though fuse element fatigue.

DETAILED DESCRIPTION OF THE INVENTION

Figure 1:
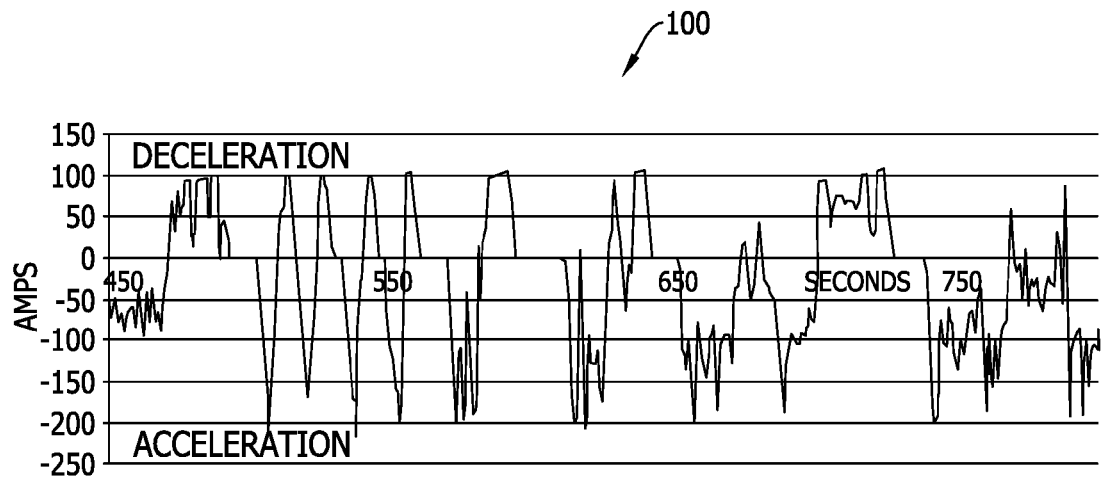
FIG. 1 illustrates an exemplary current profile that may be subjected to an electrical power fuse.

Recent advancements in electric vehicle technologies, among other things, present unique challenges to fuse manufacturers. Electric vehicle manufacturers are seeking fusible circuit protection for electrical power distribution systems operating at voltages much higher than conventional electrical power distribution systems for vehicles, while simultaneously seeking smaller fuses to meet electric vehicle specifications and demands.

Electrical power systems for conventional, internal combustion engine-powered vehicles operate at relatively low voltages, typically at or below about 48 VDC. Electrical power systems for electric-powered vehicles, referred to herein as electric vehicles (EVs), however, operate at much higher voltages. The relatively high voltage systems (e.g., 200 VDC and above) of EVs generally enables the batteries to store more energy from a power source and provide more energy to an electric motor of the vehicle with lower losses (e.g., heat loss) than conventional batteries storing energy at 12 volts or 24 volts used with internal combustion engines, and more recent 48 volt power systems.

EV original equipment manufacturers (OEMs) employ circuit protection fuses to protect electrical loads in all-battery electric vehicles (BEVs), hybrid electric vehicles (HEVs) and plug-in hybrid electric vehicles (PHEVs). Across each EV type, EV manufacturers seek to maximize the mileage range of the EV per battery charge while reducing cost of ownership. Accomplishing these objectives turns on the energy storage and power delivery of the EV system, as well as the size, volume and mass of the vehicle components that are carried by the power system. Smaller and/or lighter vehicles will more effectively meet these demands than larger and heavier vehicles, and as such all EV components are now being scrutinized for potential size, weight, and cost savings.

Generally speaking, larger components tend to have higher associated material costs, tend to increase the overall size of the EV or occupy an undue amount of space in a shrinking vehicle volume, and tend to introduce greater mass that directly reduces the vehicle mileage per single battery charge. Known high voltage circuit protection fuses are, however, relatively large and relatively heavy components. Historically, and for good reason, circuit protection fuses have tended to increase in size to meet the demands of high voltage power systems as opposed to lower voltage systems. As such, existing fuses needed to protect high voltage EV power systems are much larger than the existing fuses needed to protect the lower voltage power systems of conventional, internal combustion engine-powered vehicles. Smaller and lighter high voltage power fuses are desired to meet the needs of EV manufacturers, without sacrificing circuit protection performance.

Electrical power systems for state of the art EVs may operate at voltages as high as 450 VDC. The increased power system voltage desirably delivers more power to the EV per battery charge. Operating conditions of electrical fuses in such high voltage power systems is much more severe, however, than lower voltage systems. Specifically, specifications relating to electrical arcing conditions as the fuse opens can be particularly difficult to meet for higher voltage power systems, especially when coupled with the industry preference for reduction in the size of electrical fuses. Current cycling loads imposed on power fuses by state of the art EVs also tend to impose mechanical strain and wear that can lead to premature failure of a conventional fuse element. While known power fuses are presently available for use by EV OEMs in high voltage circuitry of state of the art EV applications, the size and weight, not to mention the cost, of conventional power fuses capable of meeting the requirements of high voltage power systems for EVs is impractically high for implementation in new EVs.

Providing relatively smaller power fuses that can capably handle high current and high battery voltages of state of the art EV power systems, while still providing acceptable interruption performance as the fuse element operates at high voltages is challenging, to say the least. Fuse manufacturers and EV manufactures would each benefit from smaller, lighter and lower cost fuses. While EV innovations are leading the markets desired for smaller, higher voltage fuses, the trend toward smaller, yet more powerful, electrical systems transcends the EV market. A variety of other power system applications would undoubtedly benefit from smaller fuses that otherwise offer comparable performance to larger, conventionally fabricated fuses. The demands imposed on electrical fuses by EV power system applications, however, presents particular challenges that may shorten a service life of the electrical fuses. Improvements are needed to long-standing and unfulfilled needs in the art.

FIG. 1 illustrates an exemplary current drive profile 100 in an EV power system application that can render a fuse, and specifically the fuse element or elements therein susceptible to load current cycling fatigue. The current is shown along a vertical axis in FIG. 1 with time shown along the horizontal axis. In typical EV power system applications, power fuses are utilized as circuit protection devices to prevent damage to electrical loads from electrical fault conditions. Considering the example of FIG. 1, EV power systems are susceptible to large variance in current loads over relatively short periods of time. The variance in current produces current pulses of various magnitude in sequences produced by seemingly random driving habits based on the actions of the driver of the EV vehicle, traffic conditions and/or road conditions. This creates a practically infinite variety of current loading cycles on the EV drive motor, the primary drive battery, and any protective power fuse included in the system.

Such random current loading conditions, exemplified in the current pulse profile of FIG. 1, are cyclic in nature for both the acceleration of the EV (corresponding to battery drain) and the deceleration of the EV (corresponding to regenerative battery charging). This current cyclic loading imposes thermal cycling stress on the fuse element, and more specifically in the so-called weak spots of the fuse element assembly in the power fuse, by way of a joule effect heating process. This thermal cyclic loading of the fuse element imposes mechanical expansion and contraction cycles on the fuse element weak-spots in particular. This repeated mechanical cyclic loading of the fuse element weak spots imposes an accumulating strain that damages the weak spots to the point of breakage in time. For the purposes of the present description, this thermal-mechanical process and phenomena is referred to herein as fuse fatigue. As explained further below, fuse fatigue is attributable mainly to creep strain as the fuse endures the drive profile. Heat generated in the fuse element weak spots is the primary mechanism leading to the onset of fuse fatigue.

Described below are exemplary fuse monitoring systems and methods that can evaluate fatigue of an electrical fuse and predict or estimate a remaining service life of a fuse toward the goal of replacing a fatigued fuse before it fails from the fatigue process. The system may accordingly provide alerts and notifications concerning a monitored fatigue state and service life information, record data and information concerning the same, communicate the data and information to remote devices, and even recognize electrical fault conditions that may cause the fuse to open prior to its expected end of service life based on the fatigue monitoring.

The fatigue monitoring is achieved at least in part by monitoring a fatigue parameter such as electrical resistance or mechanical strain, and comparing the monitored parameter to known fatigue parameters for a similar fuse element to assess a state of fatigue and remaining service life of the fuse. Fatigue monitoring may also be achieved by monitoring current flow through the fuse, calculating a strain associated with peak currents in a cyclic current load, computing a fatigue damage component for each peak current, and accumulating the fatigue damage components over time to assess a state of fatigue and an associated remaining service life of the fuse. Method aspects will be in part apparent and in part explicitly discussed in the following description.

While the present invention is described in the context of EV applications generating a current profile such as that shown in FIG. 1, and while the invention is also described in the context of a particular type and rating of a fuse to meet the needs of the exemplary EV application, the benefits of the invention are not necessarily limited to EV applications or to the particular type or ratings described. Rather the benefits of the invention are believed to more broadly accrue to many different power system applications generating other current profiles. The invention can also be practiced in part or in whole to construct different types of fuses having similar or different ratings than those discussed herein. The EV profile shown in FIG. 1 and the fuse described below are therefore discussed for the sake of illustration rather than limitation.

Figure 2:
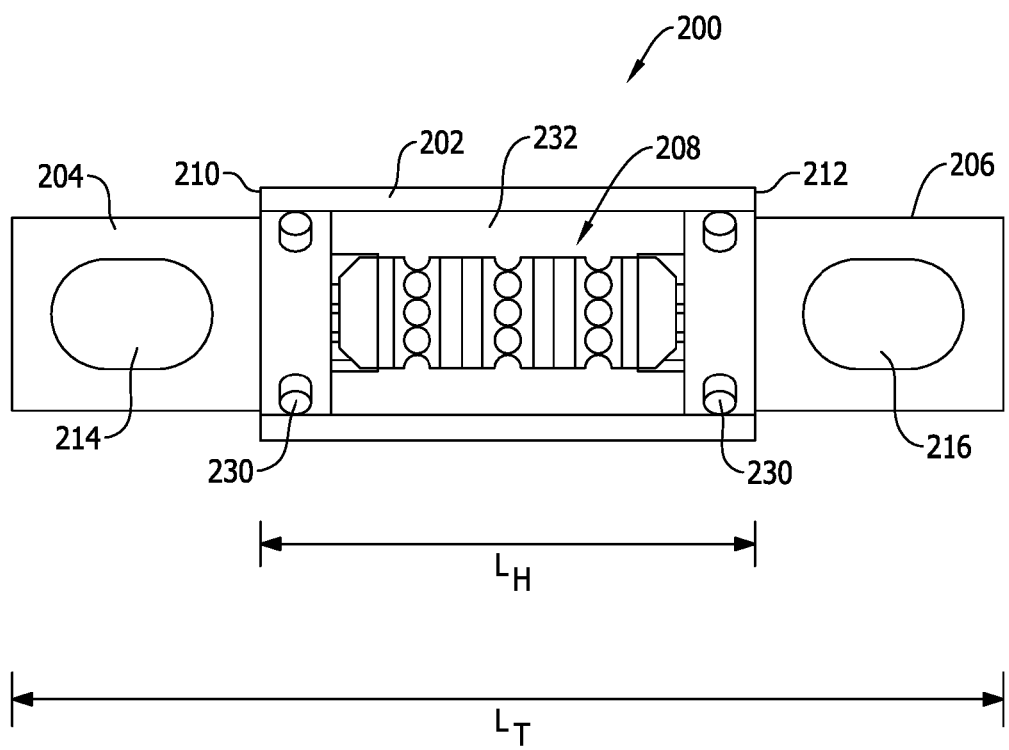
FIG. 2 is a top plan view of a high voltage power fuse that may experience the current profile shown in FIG. 1.
Figure 3:
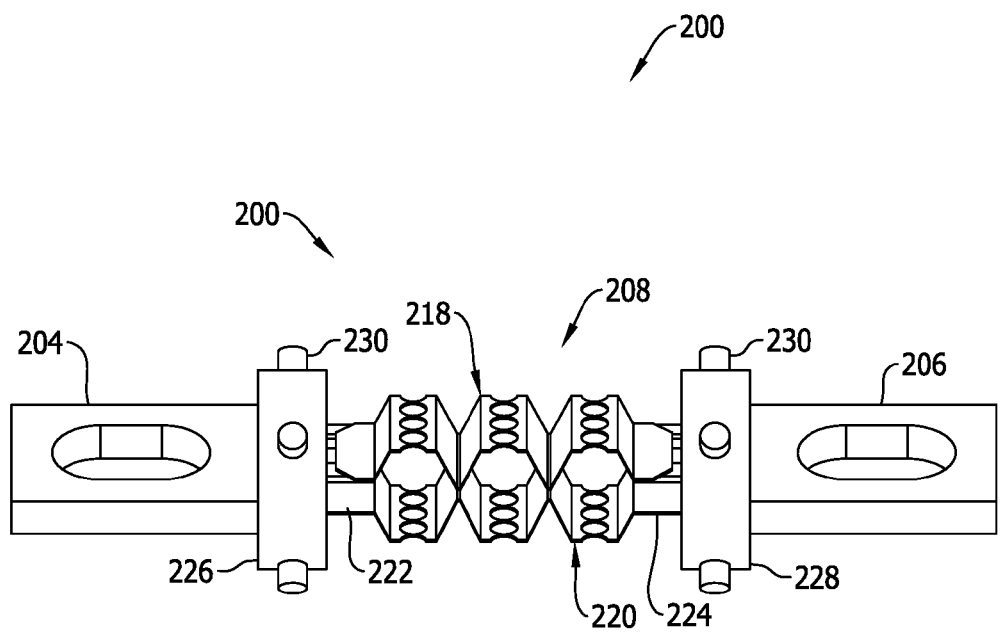
FIG. 3 is a partial perspective view of the power fuse shown in FIG. 2.
Figure 4:
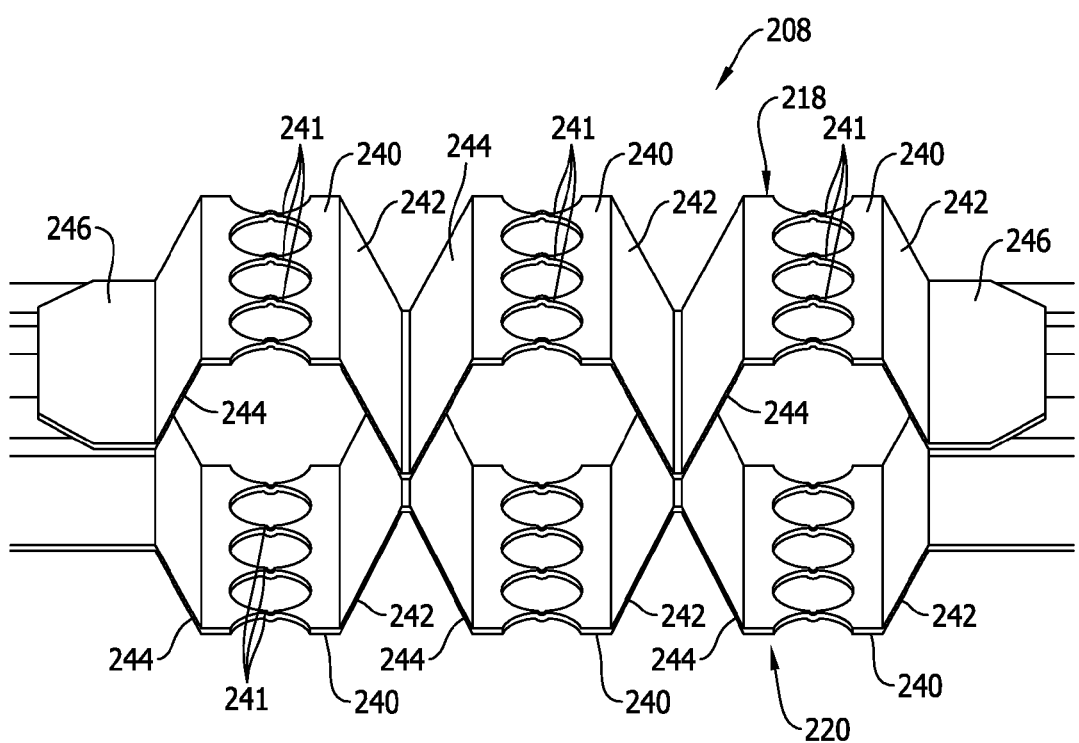
FIG. 4 is an enlarged view of the fuse element assembly shown in FIG. 3.

FIGS. 2-4 are various views of an exemplary high voltage power fuse 200 that is designed for use with an EV power system. Relative to conventional high voltage power fuses, the fuse 200 advantageously offers relatively smaller and more compact physical package size that, in turn, occupies a reduced physical volume or space in an EV. Also relative to conventional fuses, the fuse 200 advantageously offers a relatively higher power handling capacity, higher voltage operation, full range time-current operation, lower short-circuit let-through energy performance, and longer life operation and reliability in application such as the EV power system described. Method aspects will be in part explicitly discussed and in part apparent from the discussion below. Relative to a known UL Class J fuse that is constructed conventionally, the fuse 200 provides comparable performance in a much smaller package size.

As shown in FIG. 2, the power fuse 200 of the invention includes a housing 202, terminal blades 204, 206 configured for connection to line and load side circuitry, and a fuse element assembly 208 that completes an electrical connection between the terminal blades 204, 206. When subjected to predetermined current conditions, at least a portion of the fuse element assembly 208 melts, disintegrates, or otherwise structurally fails and opens the circuit path between the terminal blades 204, 206. Load side circuitry is therefore electrically isolated from the line side circuitry to protect load side circuit components and circuit from damage when electrical fault conditions occur.

The fuse 200 in one example is engineered to provide a voltage rating of 500 VDC and a current rating of 150 A. The dimensions of the fuse 200 in the example shown, wherein $L_H$ is the axial length of the housing of the fuse between its opposing ends, $R_H$ is the outer radius of the housing of the fuse, and $L_T$ is the total overall length of the fuse measured between the distal ends of the blade terminals that oppose one another on opposite sides of the housing, is about 50% of the corresponding dimensions of a known UL Class J fuse offering comparable performance in a conventional construction. Further, the volume of the fuse 200 is reduced about 87% from the volume of a conventional UL Class J fuse offering comparable performance at the same ratings. Thus, the fuse 200 offers significant size and volume reduction relative to a conventional fuse while otherwise offering comparable fuse protection performance. The size and volume reduction of the fuse 200 further contributes to weight and cost savings via reduction of the materials utilized in its construction relative to the fuse 100. Accordingly, and because of its smaller dimensions the fuse 200 is much preferred for EV power system applications.

In one example, the housing 202 is fabricated from a non-conductive material known in the art such as glass melamine in one exemplary embodiment. Other known materials suitable for the housing 202 could alternatively be used in other embodiments as desired. Additionally, the housing 202 shown is generally cylindrical or tubular and has a generally circular cross-section along an axis perpendicular to the axial length dimensions $L_H$ and $L_R$ in the exemplary embodiment shown. The housing 202 may alternatively be formed in another shape if desired, however, including but not limited to a rectangular shape having four side walls arranged orthogonally to one another, and hence having a square or rectangular-shaped cross section. The housing 202 as shown includes a first end 210, a second end 212, and an internal bore or passageway between the opposing ends 210, 212 that receives and accommodates the fuse element assembly 208.

In some embodiments the housing 202 may be fabricated from an electrically conductive material if desired, although this would require insulating gaskets and the like to electrically isolate the terminal blades 204, 206 from the housing 202.

The terminal blades 204, 206 respectively extend in opposite directions from each opposing end 210, 212 of the housing 202 and are arranged to extend in a generally co-planar relationship with one another. Each of the terminal blades 204, 206 may be fabricated from an electrically conductive material such as copper or brass in contemplated embodiments. Other known conductive materials may alternatively be used in other embodiments as desired to form the terminal blades 204, 206. Each of the terminal blades 204, 206 is formed with an aperture 214, 216 as shown in FIG. 3, and the apertures 214, 216 may receive a fastener such as a bolt (not shown) to secure the fuse 200 in place in an EV and establish line and load side circuit connections to circuit conductors via the terminal blades 204, 206.

While exemplary terminal blades 204, 206 are shown and described for the fuse 200, other terminal structures and arrangements may likewise be utilized in further and/or alternative embodiments. For example, the apertures 214, 216 may be considered optional in some embodiments and may be omitted. Knife blade contacts may be provided in lieu of the terminal blades as shown, as well as ferrule terminals or end caps as those in the art would appreciate to provide various different types of termination options. The terminal blades 204, 206 may also be arranged in a spaced apart and generally parallel orientation if desired and may project from the housing 202 at different locations than those shown.

As seen in FIG. 3 wherein the housing 202 is removed and in the enlarged view of FIG. 4, the fuse element assembly 208 includes a first fuse element 218 and a second fuse element 220 that each respectively connect to terminal contact blocks 222, 224 provided on end plates 226, 228. The end plates 226, 228 including the blocks 222, 224 are fabricated from an electrically conductive material such as copper, brass or zinc, although other conductive materials are known and may likewise be utilized in other embodiments. Mechanical and electrical connections of the fuse elements 218, 210 and the terminal contact blocks 222, 224 may be established using known techniques, including but not limited to soldering techniques.

In various embodiments, the end plates 226, 228 may be formed to include the terminal blades 204, 206 or the terminal blades 204, 206 may be separately provided and attached. The end plates 226, 228 may be considered optional in some embodiments and connection between the fuse element assembly 208 and the terminal blades 204, 206 may be established in another manner.

A number of fixing pins 230 are also shown that secure the end plates 226, 228 in position relative to the housing 202. The fixing pins 230 in one example may be fabricated from steel, although other materials are known and may be utilized if desired. In some embodiments, the pins 230 may be considered optional and may be omitted in favor of other mechanical connection features.

An arc extinguishing filler medium or material 232 surrounds the fuse element assembly 208. The filler material 232 may be introduced to the housing 202 via one or more fill openings in one of the end plates 226, 228 that are sealed with plugs (now shown). The plugs may be fabricated from steel, plastic or other materials in various embodiments. In other embodiments a fill hole or fill holes may be provided in other locations, including but not limited to the housing 202 to facilitate the introduction of the filler material 232.

In one contemplated embodiment, the filling medium 232 is composed of quartz silica sand and a sodium silicate binder. The quartz sand has a relatively high heat conduction and absorption capacity in its loose compacted state, but can be silicated to provide improved performance. For example, by adding a liquid sodium silicate solution to the sand and then drying off the free water, silicate filler material 232 may be obtained with the following advantages.

The silicate material 232 creates a thermal conduction bond of sodium silicate to the fuse elements 218 and 220, the quartz sand, the fuse housing 202, the end plates 226 and 228, and the terminal contact blocks 222, 224. This thermal bond allows for higher heat conduction from the fuse elements 218, 220 to their surroundings, circuit interfaces and conductors. The application of sodium silicate to the quartz sand aids with the conduction of heat energy out and away from the fuse elements 218, 220.

The sodium silicate mechanically binds the sand to the fuse element, terminal and housing tube increasing the thermal conduction between these materials. Conventionally, a filler material which may include sand only makes point contact with the conductive portions of the fuse elements in a fuse, whereas the silicated sand of the filler material 232 is mechanically bonded to the fuse elements. Much more efficient and effective thermal conduction is therefore made possible by the silicated filler material 232, which in part facilitates the substantial size reduction of the fuse 200 relative to known fuses offering comparable performance, including but not limited to the fuse 100 (FIG. 1).

FIG. 4 illustrates the fuse element assembly 208 in further detail. The power fuse 200 can operate at higher system voltages due to the fuse element design features in the assembly 208, that further facilitates reduction in size of the fuse 200.

As shown in FIG. 4, each of the fuse elements 218, 220 is generally formed from a strip of electrically conductive material into a series of co-planar sections 240 connected by oblique sections 242, 244. The fuse elements 218, 220 are generally formed in substantially identical shapes and geometries, but inverted relative to one another in the assembly 208. That is, the fuse elements 218, 220 in the embodiment shown are arranged in a mirror image relation to one another. Alternatively stated, one of the fuse elements 218, 220 is oriented right-side up while the other is oriented up-side down, resulting in a rather compact and space saving construction. While a particular fuse element geometry and arrangement is shown, other types of fuse elements, fuse element geometries, and arrangements of fuse elements are possible in other embodiments. The fuse elements 218, 220 need not be identically formed to one another in all embodiments. Further, in some embodiments a single fuse element may be utilized.

In the exemplary fuse elements 218, 220 shown, the oblique sections 242, 244 are formed or bent out of plane from the planar sections 240, and the oblique sections 242 have an equal and opposite slope to the oblique sections 244. That is, one of the oblique sections 242 has a positive slope and the other of the oblique sections 244 has a negative slope in the example shown. The oblique sections 242, 244 are arranged in pairs between the planar sections 240 as shown. Terminal tabs 246 are shown on either opposed end of the fuse elements 218, 220 so that electrical connection to the end plates 226, 228 may be established as described above.

In the example shown, the planar sections 240 define a plurality of sections of reduced cross-sectional area 241, referred to in the art as s. The weak spots are 241 are defined by round apertures in the planar sections 240 in the example shown. The weak spots 241 correspond to the thinnest portion of the section 240 between adjacent apertures. The reduced cross-sectional areas at the weak spots 241 will experience heat concentration as current flows through the fuse elements 218, 220, and the cross-sectional area of the weak spots 241 is strategically selected to cause the fuse elements 218 and 220 to open at the location of the weak spots 241 if specified electrical current conditions are experienced.

The plurality of the sections 240 and the plurality of weak spots 241 provided in each section 240 facilitates arc division as the fuse elements operate 218, 220. In the illustrated example, the fuse elements 218, 220 will simultaneously open at three locations corresponding to the sections 240 instead of one. Following the example illustrated, in a 450 VDC system, when the fuse elements operate to open the circuit through the fuse 200, an electrical arc will divide over the three locations of the sections 240 and the arc at each location will have the arc potential of 150 VDC instead of 450 VDC. The plurality of (e.g., four) weak spots 241 provided in each section 240 further effectively divides electrical arcing at the weak spots 241. The arc division allows a reduced amount of filler material 232, as well as a reduction in the radius of the housing 202 so that the size of the fuse 200 can be reduced.

The bent oblique sections 242, 244 between the planar sections 240 still provide a flat length for arcs to burn, but the bend angles should be carefully chosen to avoid a possibility that the arcs may combine at the corners where the sections 242, 244 intersect. The bent oblique sections 242, 244 also provide an effectively shorter length of the fuse element assembly 208 measured between the distal end of the terminal tabs 246 and in a direction parallel to the planar sections 240. The shorter effective length facilitates a reduction of the axial length of the housing of the fuse 200 that would otherwise be required if the fuse element did not include the bent sections 242, 244. The bent oblique sections 242, 244 also provide stress relief from manufacturing fatigue and thermal expansion fatigue from current cycling operation in use.

To maintain such a small fuse package with high power handling and high voltage operation aspects, special element treatments may also be applied beyond the use of silicated quartz sand in the filler 232 and the formed fuse element geometries described above. In particular the application of arc blocking or arc barrier materials such as RTV silicones or UV curing silicones may be applied adjacent the terminal tabs 246 of the fuse elements 218, 220. Silicones yielding the highest percentage of silicon dioxide (silica) have been found to perform the best in blocking or mitigating arc burn back near the terminal tabs 246. Any arcing at the terminal tabs 246 is undesirable, and accordingly the arc blocking or barrier material 250 completely surrounds the entire cross section of the fuse elements 218, 220 at the locations provided so that arcing is prevented from reaching the terminal tabs 246.

A full range time-current operation is achieved by employing two fuse element melting mechanisms in each respective fuse element 218, 220. One melting mechanism in the fuse element 218 is responsive to high current operation (or short circuit faults) and one melting mechanism in the fuse element 220 is responsive to low current operation (or overload faults). As such, the fuse element 218 is sometimes referred to as a short circuit fuse element and the fuse element 220 is sometimes referred to as an overload fuse element.

Figure 8:
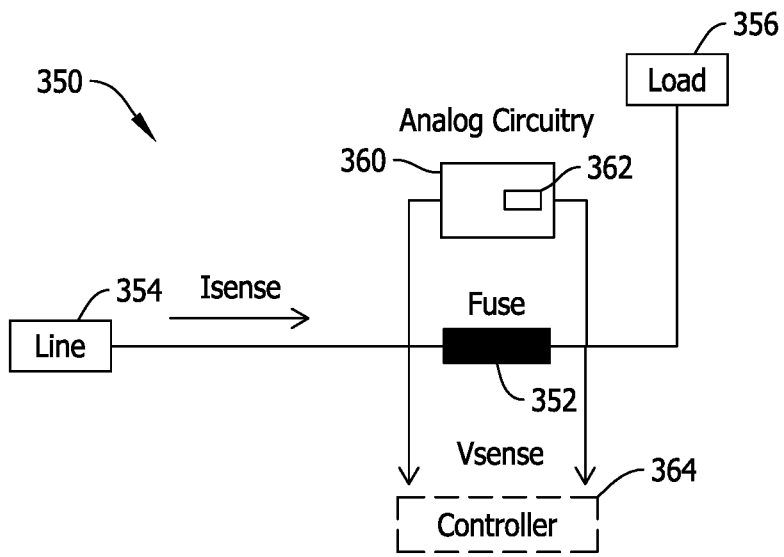
FIG. 8 is a partial circuit schematic of a portion of an electrical power system illustrating a first exemplary technique of determining a resistance of a fuse.

In a contemplated embodiment, the overload fuse element 220 may include a Metcalf effect (M-effect) coating where pure tin (Sn) is applied to the fuse element, fabricated from copper (Cu) in this example, in locations proximate the weak spots of one of the sections 240. During overload heating the Sn and Cu diffuse together in an attempt to form a eutectic material. The result is a lower melting temperature somewhere between that of Cu and Sn or about 400° C. in contemplated embodiments. The overload fuse element 220 and the section 240 including the M-effect coating will therefore respond to current conditions that will not affect the short circuit fuse element 218. While in contemplated embodiments the M-effect coating is applied to about one half of only one of the three sections 240 in the overload fuse element 220, the M-effect coating could be applied at additional ones of the sections 240 if desired. Further, the M-effect coating could be applied as spots only at the locations of the weak spots in another embodiment as opposed to a larger coating as shown in FIG. 8.

Lower short circuit let through energy is accomplished by reducing the fuse element melting cross section in the short circuit fuse element 218. This will normally have a negative effect on the fuse rating by lowering the rated ampacity due the added resistance and heat. Because the silicated sand filler material 232 more effectively removes heat from the fuse element 218, it compensates for the loss of ampacity that would otherwise result.

The application of sodium silicate to the quartz sand also aids with the conduction of heat energy out and away from the fuse element weak spots and reduces mechanical stress and strain to mitigate load current cycling fatigue that may otherwise result. In other words, the silicated filler 232 mitigates fuse fatigue by reducing an operating temperature of the fuse elements at their weak spots. The sodium silicate mechanically binds the sand to the fuse element, terminal and housing increasing the thermal conduction between these materials. Less heat is generated in the weak spots and the onset of mechanical strain and fuse fatigue is accordingly retarded relative to conventional fuses, but in an EV application in which the current profile shown in FIG. 1 is applied across the fuse, failure of the fuse elements due to fatigue, as opposed to short circuit or overload conditions, has become a practical limitation to the lifespan of the fuse. That is, while the fuse 200 was designed and engineered to provide very high current limiting performance as well as long service life and high reliability from nuisance or premature fuse operation, in an application such as the EV power system described fuse fatigue can nonetheless lead to nuisance operation of the fuse and affect the reliability of the EV power system.

The fuse elements described in the fuse 200, like conventionally designed fuses utilize metal stamped or punched fuse elements, present some concern for EV applications including the type of cyclic current loads described above. Such stamped fuse element designs whether fabricated from copper or silver or copper alloys undesirably introduce mechanical strains and stresses on the fuse element weak-spots 241 such that a shorter service life tends to result than if the fuse 200 were used in another power system having a different current load. This short fuse service life manifests itself in the form of nuisance fuse operation resulting from the mechanical fatigue of the fuse element at the weak-spots 241.

As shown in FIGS. 4-6, repeated high current pulses lead to metal fatigue in the fuse elements 218, 220 from grain boundary disruptions followed by crack propagation and failure in the fuse elements 218, 220. The mechanical constraints of the fuse elements 218, 220 are inherent in the stamped fuse element design and manufacture, which unfortunately has been found to promote buckling of the weak-spots 241 during repeated load current cycling. This bucking is the result of damage to the metal grain boundaries where a separation or slippage occurs between adjacent metal grains. Such buckling of weak-spots 241 occurs over time and is accelerated and more pronounced with higher transient current pulses. The greater the heating-cooling delta in the transient current pulses the greater the mechanical influence and thus the greater the buckling deformation of the weak spots 241.

Repeated physical mechanical manipulations of metal, caused by the heating effects of the transient current pulses, in turn cause changes in the grain structure of the metal fuse elements 218, 220. These mechanical manipulations are sometimes referred to as working the metal. Working of metals will cause a strengthening of the grain boundaries where adjacent grains are tightly constrained to neighboring grains. Over working of a metal will result in disruptions in the grain boundary where grains slip past each other and cause what is called a slip band or plane. This slippage and separation between the grains result in a localized increase of the electrical resistance that accelerates the fatigue process by increasing the heating effect of the current pulses. The formation of slip bands is where fatigue cracks are first initiated.

The inventors have found that a manufacturing method of stamping or punching metal to form the fuse elements 218, 220 causes localized slip bands on all stamped edges of the fuse element weak-spots 241 because the stamping processes to form the weak spots 241 is a shearing and tearing mechanical process. This tearing process pre-stresses the weak spots 241 with many slip band regions. The slip bands and fatigue cracks, combined with the buckling described due to heat effects, eventually lead to a premature structural failure of the weak spots 241 that are unrelated to electrical fault conditions. Such premature failure mode that does not relate to a problematic electrical condition in the power system is sometimes referred to as nuisance operation of the fuse. Since once the fuse elements 218, 220 fail the circuitry connected to the fuse is not operational again until the fuse is replaced, avoiding such nuisance operation is highly desirable in an EV power system from the perspective of both EV manufacturers and consumers. Indeed, given an increased interest in EV vehicles and the power systems therefore, the effects of fuse fatigue and related failure of a fuse are deemed to be a negative Critical to Quality (CTQ) attribute in the vehicle design.

While described in the context of an EV power system and fuse 200 therefor having stamped metal fuse elements 218, 220 the susceptibility to wear out by thermal-mechanical cycling from both the joule effect heating of normal fuse service and exposure to extreme temperature swings is not necessarily unique to EV power systems or the particular fuse or fuse elements described. Most all conventional types of fuse elements for higher voltage power fuses include fuse elements formed with one or more weak-spots of relatively fragile design and small current carrying cross sections that render them vulnerable to the fatigue issues described above. It would be desirable to provide a system that may monitor and assess a fatigue state or condition of a fuse element and facilitate proactive management of a fused electrical power system to avoid nuisance fuse operation by replacing a fatigued fuse before it fails.

As will be described in detail below, a fuse fatigue monitoring system may determine both an electrical resistance of a fuse element in an operating power system and determine the accumulation of mechanical strain to assess a state of fatigue of a fuse element over time in the electrical power system. As such, the degree of fuse element fatigue can be monitored, measured and calculated to predict the approximate service life remaining for the fuse in a system of the invention. Such a system may provide status information or alert information so that a fuse suffering from fatigue may be replaced before it fractures in nuisance operation. The replacement may occur at a convenient scheduled time in view of such information so that power system administrators may proactively replace identified fuses when the electrical loads of the power system are the least affected.

As demonstrated in the resistance versus time plot 300 of FIG. 7, a fuse, including but not limited to the fuse 200 described above, can be seen to age in service use due the fatigue process. That is, over time the fuse element accumulates mechanical strain from heating cycles such as those described above. The mechanical strain in the fuse element (s) is most concentrated in the fuse element weak spots where the metal grains are being worked and reoriented. As described above, this working of the grain structure eventually leads to disruptions in the grain boundaries and the development of slip bands between the grains. The formation of slip bands, in turn, eventually leads to crack formation and damage of the (s) in the fuse element as discussed above.

As this fatigue process progresses, and as seen in the plot 300 of FIG. 7, the electrical resistance of the fuse element increases due to the mechanical damage of the weak-spots. This increase in resistance begins to add heat to each current loading cycle such that the fuse aging or wear out from fatigue is accelerated. As the fuse ages electrically the original manufactured resistance measurement will begin to increase. Depending on the level of service exposure this resistance increase is typically very small and very slow as is evident in a first stage 302 of the plot 300 shown in FIG. 7. In the early life of the fuse service in the early stage 302 the change in fuse resistance is practically unperceivable and masked by system noise and measurement error. Eventually, however, the resistance changes to a level where it can be reliably detected even in the first stage 302, and in the first stage 302 the fuse element continues to very gradually increase in resistance as the fatigue process continues. In the example shown, the fuse may remain in the first stage 302 for about 25 years.

Eventually, however, and at about 25 years into the fuse life of the fuse element in the example shown, the fuse element fatigue will leave the first stage 302 and enter a transition stage 304 seen in the plot 300 in which the resistance begins to change more rapidly. This indicates that the fatigue of the fuse element has advanced to the point where its effects are accelerating. As the fatigue process continues to progress in this stage 304 the electrical resistance of the fuse element increases due to the mechanical damage of the weak-spots that is now beginning to materialize. The increase in resistance increases the heat experienced by the weak spots in each current loading cycle such that the fuse aging or wear out accelerates at a greater pace. It is seen in the transition stage 304 that the change in resistance is non-linear. In this transition stage 304 the changes in resistance are more easily detected than in the first stage 302. The transition stage 304 can last for an extended time, however, such that once this stage is detected there still remains years of service life of the fuse. It is seen in the example of FIG. 7 that the transition stage 304 may last for about five years.

At the end of the transition stage 304, a third and final stage 306 of fatigue is entered where the fuse resistance enters a steep change in resistance over a short period of time. This final stage indicates that cracks in the fuse element exist and the cross sectional area of the weak spots for current flow is rapidly decreasing, resulting in even higher heat concentration in the weak spots. The fuse element will not last long in this condition, and if not replaced first, the fuse element will fracture shortly after it reaches the third stage 306.

Knowing that the fuse element will fatigue and that the mechanical degradation of the fuse elements at the weak spots exhibits a marked increase in resistance over time as the fuse progress through the stages 302 and 304 into the stage 306, by measuring the fuse resistance over time a fatigue monitoring system of the invention can assess the state of fatigue of a fuse in operation. A plot similar to that shown in FIG. 7 can be empirically determined or otherwise calculated given an expected number of heating cycles for the fuse in the electrical power system, which may be not necessarily be an electrical power system for an EV.

In a contemplated system of the invention, the measurement of the fuse resistance may be made with precision by injecting a known current across the fuse element as further described below. That is, the system may measure the fuse resistance while it is in service, and algorithms may be developed to assess the changes in resistance and estimate or calculate a remaining service life of the fuse based on the change in resistance. It is recognized that measuring the fuse resistance while in service may be challenging in certain types of power systems and/or not that practical, in which case the alternative method of predicting fuse life in view of fatigue explained below may be utilized.

FIG. 8 illustrates a first exemplary system 350 and technique of sensing fuse resistance at any point in time, and as a result also sensing the current flowing through a fuse 352, which may be the fuse 200 described above, that is connected between line-side circuitry 354 and load-side circuitry 356 in an electrical power system according to a contemplated embodiment of the present invention. A voltage $V_{sense}$ is derived directly across the fuse 352 that allows the resistance of the fuse element to be determined and the current $I_{sense}$ may then likewise be determined. Resistance determination and current sensing capability facilitates advanced fuse status features, abnormal fuse detection and alarms, etc. in the system 300.

Sensing the voltage $V_{sense}$ directly across the fuse 352 to determine the current $I_{sense}$ introduces complications that are addressed by compensation circuitry 360. Specifically, the fuse element in the fuse 352, as do all fuse elements, exhibits a non-linear resistance that precludes a simple and direct application of Ohm's law to calculate the current $I_{sense}$ because the resistance of the fuse element in the fuse 352 is not constant in use.

The compensation circuitry 360 may accordingly include a controller 362 that measures the fuse element resistance at periodic intervals to account for variations in fuse resistance. Alternatively, the controller 362 need not be a part of the compensation circuitry 360 itself in all embodiments but instead the controller 362 may be separately provided. The voltage $V_{sense}$ in some embodiments may be input to another optional controller 364 that calculates the current $I_{sense}$ as described below. It is understood, however, that the functionality of the controllers 362, 364 shown may be combined into a single controller if desired.

The controllers 362 and/or 364 may be processor-based control devices. As used herein, the term "processor-based" shall refer not only to controller devices including a processor or microprocessor, but also to other equivalent elements such as microcomputers, programmable logic controllers, reduced instruction set (RISC) circuits, application specific integrated circuits and other programmable circuits, logic circuits, equivalents thereof, and any other circuit or processor capable of executing the functions described below. The processor-based devices listed above are exemplary only, and are thus not intended to limit in any way the definition and/or meaning of the term "processor-based".

The technique shown in FIG. 8 recognizes that the fuse 352, as are all electrical fuses, is essentially a calibrated resistor. Because a resistor drops a voltage during operation, knowing the resistance of the fuse element in the fuse 352 (as determined by one of the controllers 362, 364) and also knowing the voltage $V_{sense}$, the current $I_{sense}$ can be calculated using relationships derived from Ohms Law while achieving a relatively small and cost effective sensing system. The current sensing technique shown in FIG. 8, and also further described below in an exemplary implementation in FIG. 9 can be applied on practically any type of fuse with advantageous effect.

In contemplated embodiments, algorithms are utilized to translate the non-linear response of the fuse element into accurate current readings. Unique non-linear fuse coefficients can then be coded onto or into the individual fuse 352 with, for example, an RFID tag or bar code label. As also described below, a fuse reader may alternatively be integrated into a housing of a fuse holder or a housing of a disconnect switch, sometimes referred to as a base, along with current monitor electronics. Since the fuse 352 introduces non-linear resistance aspects to the current monitoring equation, electronic circuit assisted sensing or acquisition is proposed along with algorithms to compensate for non-linear fuse resistance.

Since each fuse being monitored by the system 350 can have its own unique and individual variables and properties, a scheme for coding these unique variables and properties may be required for proper and accurate translation of the resistor voltage to a resistance and/or current measurement. A coding scheme may include RFID tagging and/or bar code labeling and the like. It shall be understood that the proposed concept shown in FIG. 8 can be used for both direct current (DC) and alternating current (AC) current sensing and measurement as illustrated in the examples below.

Those in the art will appreciate that the electronic circuitry proposed requires an appropriate isolation scheme to isolate the system voltage of the electrical power system from the electronics. Once determined, current data can be transmitted to a remote location, via, for example, optical or wireless communication systems, although other types of communication are possible if desired.

Figure 9:
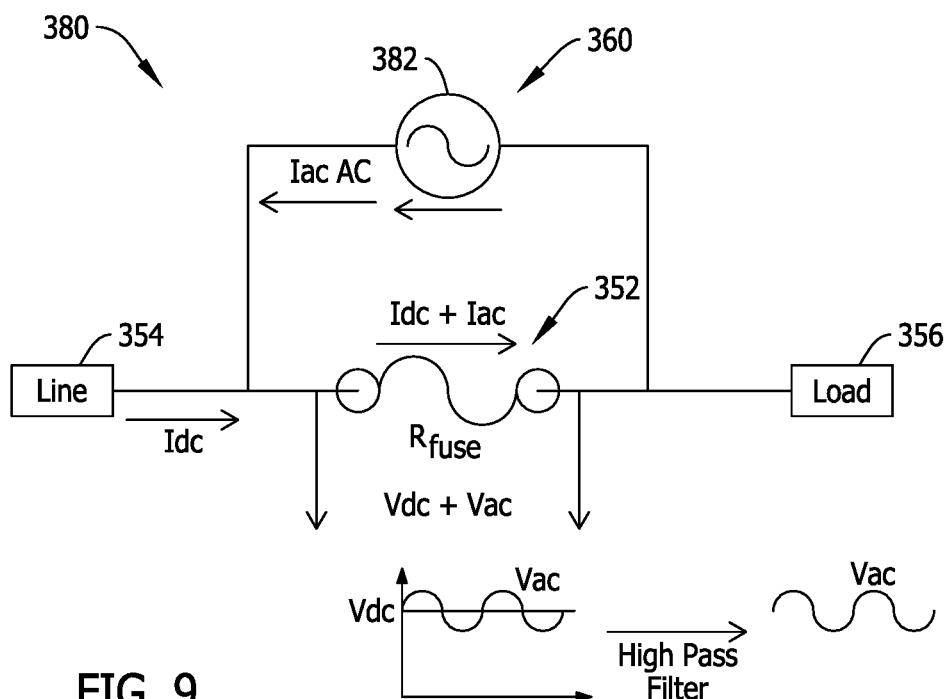
FIG. 9 is a partial circuit schematic of a portion of an electrical power system illustrating a second exemplary technique of determining a resistance of a fuse.

FIG. 9 is a partial circuit schematic of a more specific system 380 and technique for determining fuse element resistance and therefore facilitating current sensing according to an embodiment of the present invention.

As shown in FIG. 9, line side circuitry 354 delivers a current input $I_{dc}$ to the fuse 352 including a fuse element. The circuit 360 is connected in electrical parallel with the fuse element as shown in FIG. 8, and the circuit 360 includes a current source 382 that injects an AC current injection $I_{ac}$ at a preset frequency. Applying Ohm's law, the following relationships apply:

$$R_{fuse} = \frac{V_{ac}}{I_{ac}}$$

$$I_{dc} = \frac{V_{dc}}{R_{fuse}}$$

The current flowing through the fuse element 352 is the sum of $I_{dc}$ and $I_{ac}$, and the sensed voltage across the fuse element 352 is the sum of $V_{ac}$ and $V_{dc}$. As seen in FIG. 9, the sensed voltage may be subjected to a high pass filter to obtain the voltage $V_{ac}$. $R_{fuse}$ can now be determined as $V_{ac}$ and $I_{ac}$ are both known. Once $R_{fuse}$ is known, $I_{dc}$ can be calculated since $V_{dc}$ is known. The relationships and calculations may be repeated at any desired time interval to account for non-linear resistance behavior of the fuse element over time. While an exemplary technique is shown in FIG. 9 that allows the resistance and current to be determined, other circuit arrangements are shown and described in U.S. application Ser. No. 14/803,315 referenced above and may likewise be utilized.

By determining specific resistances and correlated currents over time, the system 380 can compare resistance and current data to previously determined resistance and current data, or compare the resistance and current data to a predetermined baseline, to detect changes in resistance over time and to assess fuse fatigue. For example, as fuse fatigue progresses as explained above in relation to FIG. 9 the determined resistance exhibited at the same (or approximately the same) current levels will increase over time in a manner that can be detected and evaluated. Based on the magnitude of detected changes in fuse resistance, service life of the fuse may be estimated or predicted as described above. For example, based on a detected rate of change of resistance over time, the controller 362 or 364 may infer whether the fuse element is in the first stage 302, the second stage 304 or the final stage 306 in the plot shown in FIG. 7. In the first stage 302 the system 380 may provide information regarding the level of fatigue that has been assessed, if any. The system 300 may provide an alert or notification sometime in the second stage 304 to power system personnel alerting them to the fatigued condition of the fuse 352 with an estimated service life remaining to give ample opportunity for the fuse to be proactively replaced before the stage 306 is entered.

The system 350, 380 and methods described are easiest to implement and are more accurate in electrical power systems having a relatively stable current load, but is more difficult in an EV power system having a random-type cyclic current pulse profile such as that shown in FIG. 1. Nonetheless, the system 350, 380 and methods may be useful to provide some assessment and indication of a state of sfatigue of the fuse in an EV power system. Data collected by the system 350, 380 may be beneficially used to refine algorithms to increase the accuracy of the resistance and fatigue assessments made, and the related predicted service remaining of a fuse being monitored.

As an alternative to the techniques shown in FIGS. 7-9 that monitor resistance to evaluate fuse element fatigue, algorithms can be developed to monitor the strain accumulation in the fuse element weak spots for advising service life actions as explained next in relation to FIGS. 10-13.

Figure 10:
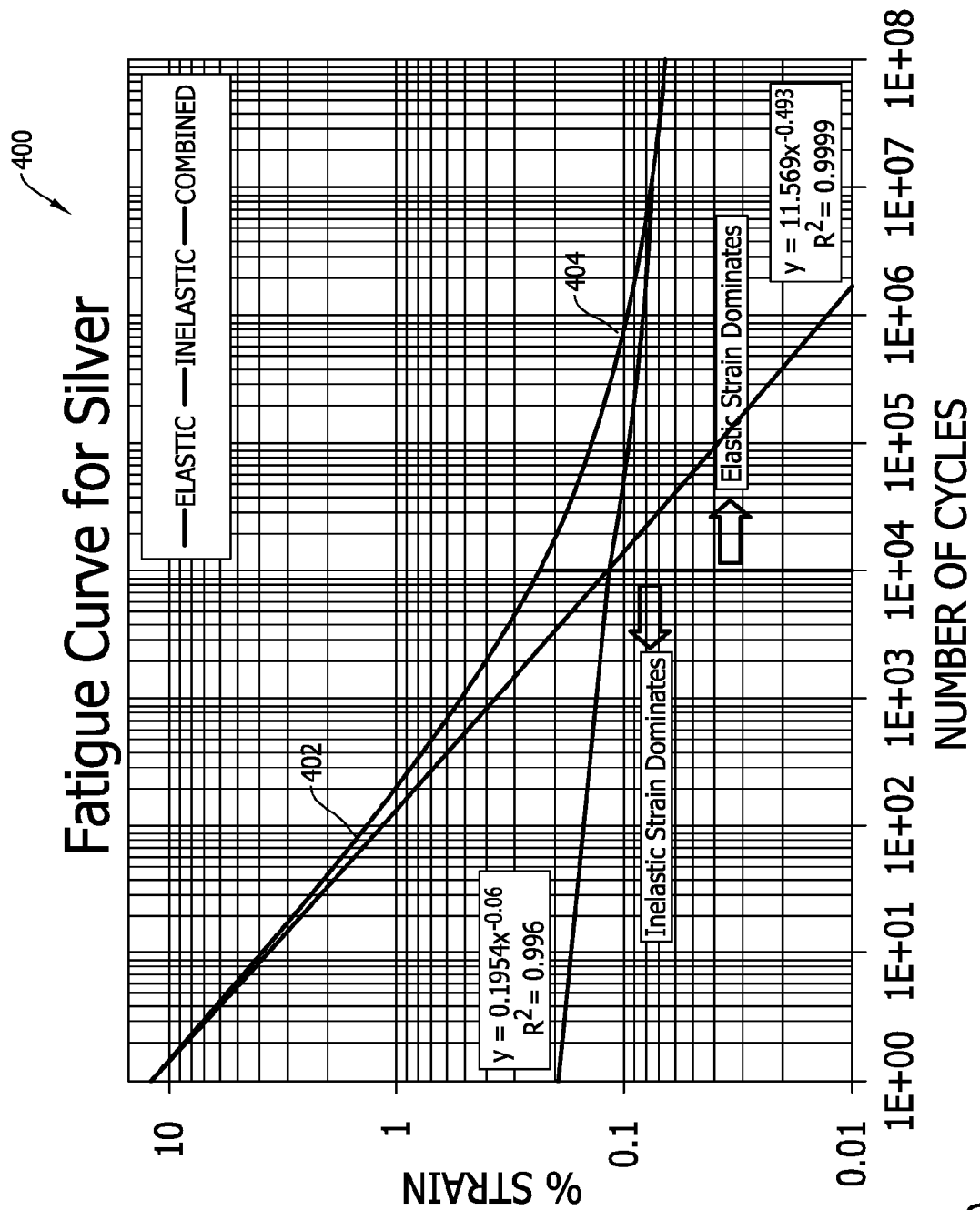
FIG. 10 is an exemplary strain versus cycles plot for a silver fuse element and illustrating a fuse element fatigue thereof.

FIG. 10 shows an exemplary strain versus cycle plot that shows the effects of fuse fatigue. The strain accumulation in the fuse element weak spots is directly related to the magnitude and frequency of both current and thermal pulses or cycles imposed on the fuse element. Using known relationships, this mechanical strain can be calculated from the joule heating of the weak-spot during a current cycle event.

These strain measurement can be compared to known fatigue curves for metals to predict the number of cycles to failure. This can be implemented in a system similar to the system 350, 380 described wherein a controller monitors current cycles, and calculates strain associated with the cycles to make the comparisons and service life estimates or predictions.

In the example plot of FIG. 10, a fatigue curve 400 is plotted for a silver fuse element. The strain is plotted on the vertical axis and the number of cycles is plotted along the horizontal axis. In a first region 402 of the plot, the fuse element exhibits elastic strain, but after a number of thermal cycles, a second region 404 is seen that exhibits generally inelastic strain. The inelastic strain is an indication of advanced fuse fatigue. As the number of cycles increases in the second region 404 toward nearly 100% vertical strain, the fuse element is rapidly deteriorated to the point of failure. Therefore, a system of the present invention like the system 350, 380 may monitor changes in strain over a number of cycles and estimate the state of fatigue and remaining service life in the fuse by comparing it to a known plot such as that shown in FIG. 10, or evaluating a rate of change of the strain over time to infer whether the fuse element is in the first stage 402 or the second stage 404 of fatigue.

Plots such as those shown in FIG. 10 may be calculated or empirically determined for fuse elements made of various metals or metal alloys and also for different geometries of fuse elements. Strain measurements can be made and compared by a system of the invention to known fatigue curves for metals to predict the number of cycles to failure. Specifically, in a system like the system 350, 380 the controller 362 or 364 may take the strain measurements and evaluate them to infer whether the fuse element is in the first stage 402 or the second stage 404 of fuse fatigue. In the first stage 402 the system 350, 380 may provide information regarding the level of fatigue that has been assessed, if any. The system 350, 380 may provide an alert or notification sometime in the second stage 404 to power system personnel alerting them to the fatigued condition of the fuse 352 with an estimated service life remaining to give ample opportunity for the fuse to be proactively replaced before it fails due to advance fatigue. This strain measurement technique can in some cases be combined with the resistance measurement techniques described above to provide a degree of redundancy to the system.

Figure 11:
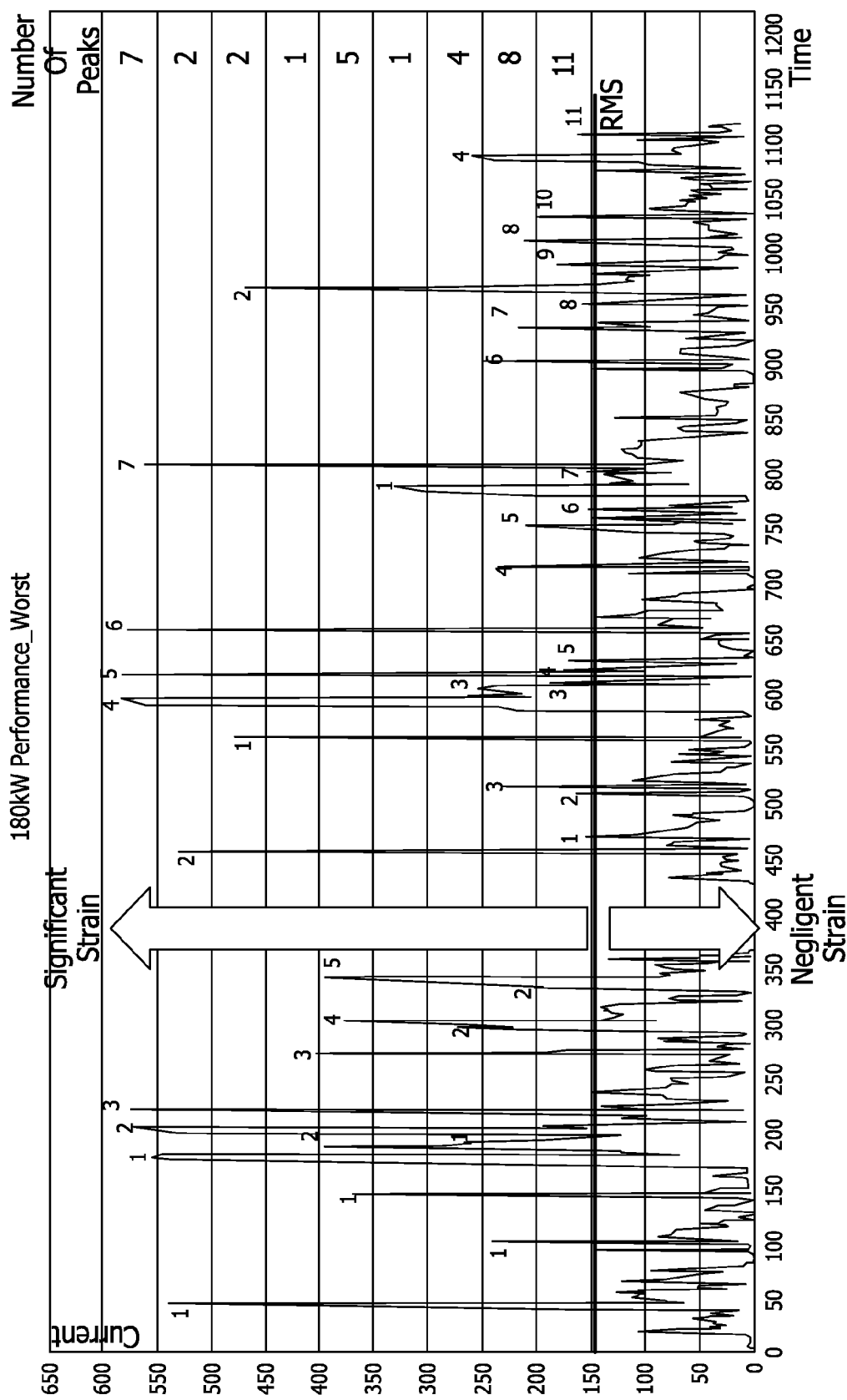
FIG. 11 illustrate an exemplary current versus time plot from which strain cycles may be determined in a predictive fuse fatigue evaluation system.

FIG. 11 illustrates an exemplary current versus time plot to demonstrate yet another technique of evaluating fuse element fatigue that may be utilized in a system similar to the system 350, 380. As shown in FIG. 11, for a fuse being monitored (which may be the fuse 200 described above), at currents below about 150 A the current strain is considered to be negligible, whereas above about 150 A the strain is not negligible. Further, bands or ranges of current are plotted above about 150 A that identify different regions or zones of amperage in which respective peak currents are counted across the current profile shown. In the example of FIG. 1, the bands correspond to 150 A to 200 A, 200 A to 250 A, 250 A to 300 A, 350 A to 400 A, 450 A to 500 A, 500 A to 550 A and 550 A to 600 A. Along the pulsed current profile, which may be produced by an EV power system, the respective peak currents in each band is seen to be 11, 8, 4, 1, 5, 1, 2, 2 and 7 over the period of time shown in FIG. 11. Each peak current in each zone represents an amount of strain that can be calculated according to known relationships, so the strain corresponding to each peak can be accumulated to estimate the amount of fatigue that the fuse element experiences with each peak current cycle and/or an estimated service life remaining. Algorithms can be developed to monitor the fuse current in a system similar to the system 350, 380 described above, wherein one of the controllers 362, 364 may calculate the strain accumulation for advising service life actions. This technique can in some cases be combined with the resistance measurement techniques described above for a degree of redundancy to the fatigue assessments made. Regardless, once the strain calculations are made for each peak current event the total accumulated damage can be represented with Miner's rule for the purpose of predicting a remaining service life of the fuse.

Miner's rule is one of the most widely used cumulative damage models for failures caused by fatigue. It is called "Miner's rule" because it was popularized by M. A. Miner in 1945. Miner's rule is probably the simplest cumulative damage model and may easily be implemented in a system like the system 350, 380 described with the controller 362 or 364 making the calculations and providing the desired outputs of fatigue state and/or predicted service life. Miner's rule states that if there are k different stress levels and the average number of cycles to failure at the ith stress, $S_i$, is $N_i$, then the damage fraction, C, follows the following relationship:

$$\sum_{i=1}^{k} \frac{n_i}{N_i} = \frac{n_1}{N_1} + \frac{n_2}{N_2} + \ldots + \frac{n_k}{N_k} = C$$

where $n_i$ is the number of cycles accumulated at stress $S_i$ and C is the fraction of life consumed by exposure to the cycles at the different stress levels.

In general, when the damage fraction C reaches 1.0, failure of the fuse element occurs due to fatigue. As a general rule and for maintaining long service life of metals under fatigue influence it is advantageous to keep C as small as possible. In other words efforts to keep C further away from reaching 1 will assure high life reliability. Expressed mathematically, the following relationship applies and may be utilized to optimize design elements based on data collected from the system of the invention:

$$\text{Miner's Rule:} \quad \frac{n_1}{N_1} + \frac{n_2}{N_2} + \ldots + \frac{n_k}{N_k} < 1$$

The application of Miner's rule to a fuse such as the fuse 200 described above in response to a particular drive cycle may be tabulated such as in the example table below. The peak currents and zones as described above are calculated to individually create a calculated amount of strain using known relationships. The number of cycles to failure for each of the peak current levels is also calculated and shown. The controllers 362 or 364 in the system then count the number of current cycles in each zone and divides the number of cycles by the number of cycles to failure to determine a cumulative damage component from those cycles. The damage components for the different zones may be accumulated to assess the total damage from the current cycles in all of the zones.

For example, the strain from a park event of the EV is shown in the first row in the table below. The number of cycles to failure from this current zone is 419,923. The controller has counted 36,000 cycles of the park event, so the damage component is 36,000/419,932 or 0.0857. The corresponding damage calculation for the subsequent five rows is effectively zero, and the calculations for the last three rows are non-zero. The total accumulated damage is seen to be 0.2139 and indicates that about 21% of the expected service life has been consumed, with about 79% of the expected service life remaining. The data shown in the table can be analyzed for possible performance improvements and re-design of the fuse elements based on data collected by the system in operation to keep the accumulated damage over time as low as possible in view of expected current loads, and less than 1.0 when the fuse elements will fail due to fatigue.

Figure 12:
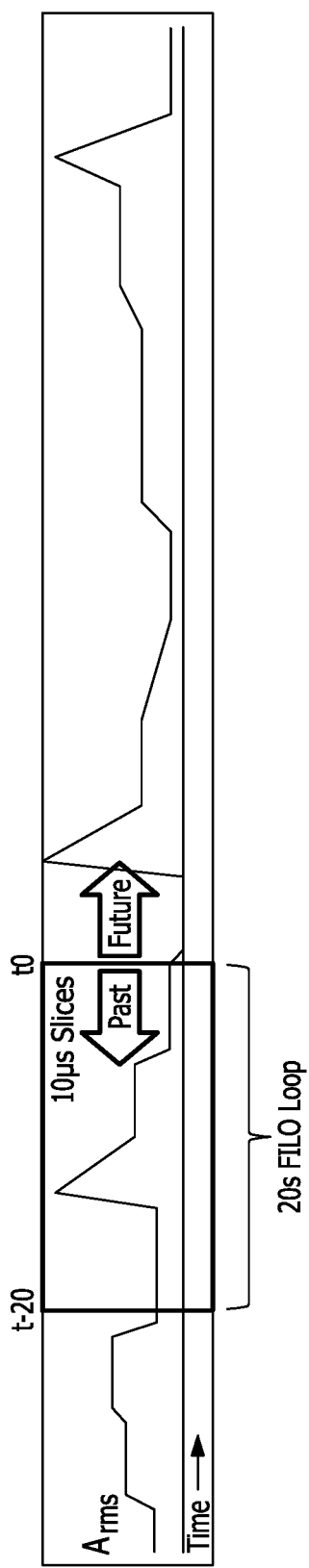
FIG. 12 illustrates an exemplary measuring window for a current versus time plot for a predictive fuse fatigue evaluation system of the invention.
Figure 13:
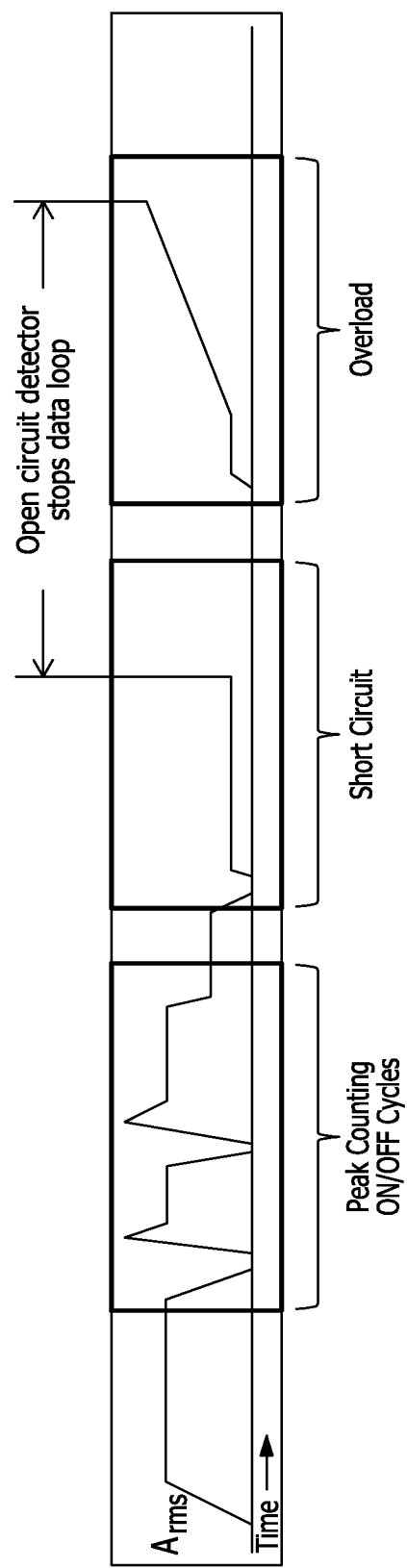
FIG. 13 illustrates exemplary fuse monitoring modes for the fuse fatigue evaluation system of the invention.

As shown in FIG. 13, the system of the invention can, in addition to detecting fatigue conditions and communicating the same, also detect a fault type. The first window on the left in FIG. 13 shows a normal operating condition in which the fuse element is intact and withstanding current peaks, and like the window shown in FIG. 12, a system controller 362 or 364 may assess fatigue condition based on the data collected in the window. The second or middle window in FIG. 13 shows a short circuit condition that may be recognized by one of the controllers 362, 364 in a system of the invention. The third window on the right in FIG. 13 shows an overload condition that may be recognized by one of the controllers 362, 364 in the system of the invention. Since

|  | | Drive Profile Data | | | | | 180 kW Profile | | |
|---|---|---|---|---|---|---|---|---|---|
|  | ON Peak Current (A) | OFF Current (A) | Mean Strain | Alternating Strain | Effective Strain | Cycles To Failure | 300 Profile Cycles | Damage | Cumulative Damage Accumulation |
| Outer Weak-Spots | 135 Park | 0 | 0.2612 | 0.10702 | 0.10945 | 419,923 | 36,000 | 0.0857 | 0.0857 |
|  | 135 Charging | 0 | 0.0673 | 0.06727 | 0.06766 | 3.92E+07 | 1,200 | 0 | 0.0858 |
|  | 200 | 135 | 0.3185 | 0.0017 | 0.00174 | 1.43E+34 | 21,660 | 0 | 0.0858 |
|  | 250 | 135 | 0.3286 | 0.00875 | 0.009 | 1.89E+22 | 10,200 | 0 | 0.0858 |
|  | 300 | 135 | 0.3021 | 0.01763 | 0.0181 | 1.67E+17 | 2,700 | 0 | 0.0858 |
|  | 350 | 135 | 0.35 | 0.0298 | 0.03071 | 2.48E+13 | 6,600 | 0 | 0.0858 |
|  | 400 | 135 | 0.3858 | 0.04729 | 0.04881 | 1.15E+10 | 1,500 | 0 | 0.0858 |
|  | 450 | 135 | 0.385 | 0.07086 | 0.07325 | 2.36E+07 | 4,800 | 0.0002 | 0.086 |
|  | 500 | 135 | 0.4082 | 0.09759 | 0.1011 | 775,119 | 3,600 | 0.0046 | 0.0906 |
|  | 550 | 135 | 0.4328 | 0.12297 | 0.12766 | 153,304 | 18,900 | 0.1233 | 0.2139 |

The technique illustrated in the table above allows the system controller 362 or 364 to provide information regarding the level of fatigue that has been assessed at any desired time. The system 350, 380 may provide an alert or notification to power system personnel sometime at a predetermined accumulated damage threshold below 1.0 (e.g., when the accumulated damage is about 0.80 or about 80% of service life is consumed). The notification may alert personnel to the fatigued condition of the fuse 352 with an estimated service life remaining to give ample opportunity for the fuse to be proactively replaced before it fails due to advance fatigue. This accumulated damage assessment technique can in some cases be combined with the resistance measurement and strain measurement techniques described above to provide a degree of redundancy to the system. In an embodiment wherein more than one of the fatigue assessments are utilized using the parameters described (e.g., resistance, strain. or accumulated fatigue damage), the results can be compared to one another for confirmation of the results and/or to detect an error condition when one of the fatigue assessments contradicts another.

As demonstrated in FIGS. 12 and 13 a predetermined window of time, such as the last 20 seconds of the fuse life may be continuously recorded in a system such as the system 300. The current data in the window is stored by one of the controllers 362, 364. At any time this data can be retrieved and communicated by the controller to another device. Algorithms may be developed to analyze the data recorded in such a window for fatigue and/or strain using similar techniques to those described below. Like the systems described above, notifications can be sent regarding the state of fatigue to facilitate proactive management of the power system and avoid opening of the fuse due to fatigue. Like the foregoing embodiments, notifications may include information regarding service life consumed and/or service life remaining.

either the conditions in the second and third windows cause the fuse to open to protect the load-side circuitry, one of the controllers 362, 364 based on the respective recorded window can infer whether the cause was a short circuit condition or an overload condition based on the last 20 seconds of recorded fuse life. The system can accordingly send alerts and notification not only that the fuse has opened, but the cause of the opening for power system administrators to take appropriate action.

Using the techniques demonstrated in FIGS. 12 and 13, algorithms may be developed that monitor the last seconds or minutes of the fuse current prior to fuse operation or fuse opening. A looping memory cache may record the fault current event. At any time the memory in the system can be read for obtaining the circuit status for current usage. Upon a fault event the algorithm would sense the fuse opening and halt the memory looping to preserve the recording of the actual fault image or data. The fatigue state, circuit current, or fault current can be retrieved at any time by one of several communication schemes. Wireless communication methods, a number of which are known, offer the most convenient method due to the lack of physical wiring. Wireless communication may be established using, for example, RFID, WIFI or Bluetooth communication schemes for data retrieval and communication using the appropriate protocols.

Figure 14:
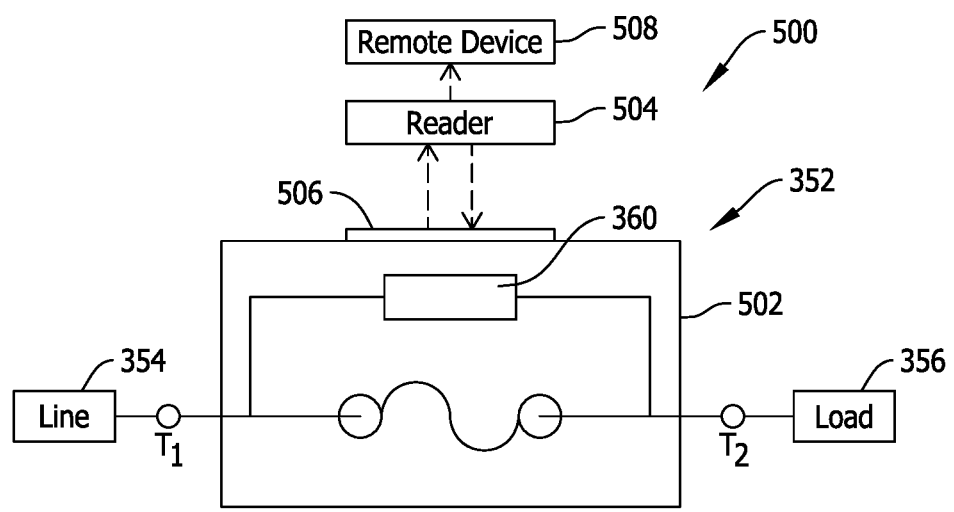
FIG. 14 schematically represents a first exemplary fuse fatigue evaluation system according to an embodiment of the present invention.

FIG. 14 schematically represents a first exemplary fuse fatigue evaluation system 500 according to an embodiment of the present invention. The system 500 includes the fuse 352 including the fuse element and the circuitry 360 connected in parallel with the fuse element inside a fuse housing 502. The fuse housing 502 is provided with fuse terminals $T_1$ and $T_2$ for establishing electrical connection with the line side circuitry 354 and the load side circuitry 356.

The fuse element may be provided in any structural shape and configuration desired, including but not limited to the fuse elements 218, 220 described above, and may be designed to open in response to any overcurrent condition desired. The housing 502 may likewise be provided in any shape desired, including but not necessarily limited to round cylindrical shapes and rectangular shapes, and may be filled with an arc-extinguishing media such as that described above or otherwise known in the art. The fuse terminals $T_1$ and $T_2$ may be any known fuse terminal shape and configuration, including but not necessarily limited to end caps or ferrules, knife blade contacts, or terminal blades. In some contemplated embodiments the fuse 352 may be configured as a CUBEFuse® modular fuse of Bussmann by Eaton, St. Louis, Mo. having a rectangular housing and terminal blades projecting from a common side of the rectangular housing. Regardless, and as shown in FIG. 14, the compensation circuit 360 is embedded in the fuse construction. That is, the circuit 360 and electronics such as those described above are inside the fuse housing 502 and are accordingly built-in to the fuse.

A reader device 504 is shown as a separately provided device in the system 500. The reader device 504 may be a portable device in some embodiments or may be mounted stationary in other embodiments. In some embodiments the reader device 504 may be hand-held device. The reader device 504 may be a processor-based device and may communicate wirelessly with the circuitry 360 to receive the sensed voltage information or other data needed to analyze or calculate the current being sensed in the manner described above. While wireless communication between the circuitry 360 and the reader device 504 is beneficial in a large electrical power system, it is not in all cases strictly necessary and the reader device 504 may instead be hard-wired to the circuitry 360 via connecting ports and terminals in the fuse 352 if desired.

The reader device 504 in a contemplated embodiment may be configured as an RFID reader or interrogator device. In such an embodiment, once the information is obtained from a corresponding RFID element in the circuit 360, the resistance and current to make the fatigue assessments described above can be calculated by the reader device 504, or in an embodiment wherein the resistance or current is calculated within the electronics embedded in the fuse 352, the calculated resistance or current can simply be communicated to the reader device 504.

As previously mentioned, the fuse 352 may be provided with an RFID label or bar code label 506 on the housing 502 of the fuse 352. The label 506 may include encoded information to be communicated to a reader device 504. The reader device 504 may accordingly be a multi-functional device including multiple means of communicating with elements of the fuse. The RFID label or bar code label may include identifying information for the fuse 352, rating information for the fuse 352, and coded information facilitating the calculation of resistance or the sensed current that allow the fatigue assessments described above to be made. As such, by reading the label or bar code on the fuse housing, the reader device 504 can know which one of multiple predetermined algorithms to use to calculate the resistance and current, and the reader device may also obtain any coefficients that may be unique the fuse 352 for use in the algorithm. In such a scenario, the reader device 504 is an intelligent device that can distinguish different types of fuses and select one of a variety of predetermined algorithms to calculate the sensed current.

Once obtained, the information obtained by the reader device 504, including the calculated current and fatigue assessments, can further be communicated to a remote device 508 via any desired communication network. The remote device 508 may facilitate monitoring and oversight of the electrical power system and any related processes. The remote device 508 may, for example, be part of a vehicle control system or a Supervisory Control and Data Acquisition (SCADA) system monitoring aspects of an industrial facility and processes as those in the art may appreciate.

It is appreciated that in some embodiments the sensed current and assessed fatigue could actually be calculated or determined by the remote device 508 at the remote location if desired, with the reader device 504 supplying only the information needed to make the calculation. Varying degrees of sophistication and complexity in the reader device 504 can be provided in the system 500 proposed at varying cost.

Figure 15:
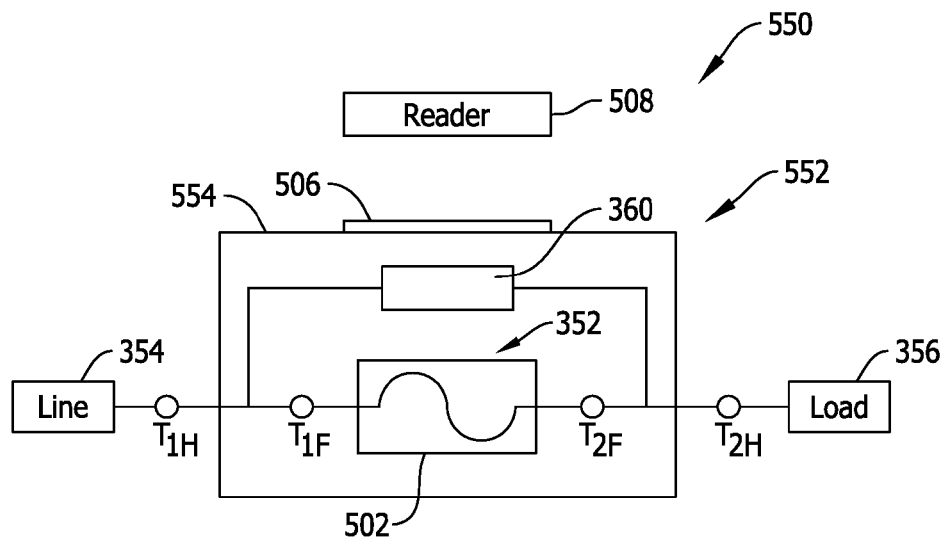
FIG. 15 schematically represents a second exemplary fuse fatigue evaluation system according to an embodiment of the present invention.

FIG. 15 schematically represents a second exemplary fuse fatigue evaluation system 550 according to another embodiment of the present invention. The system 550 includes a fuse holder or fuse block 552 including a housing 554 provided with terminals $T_{1H}$ and $T_{2H}$ respectively configured to structurally establish electrical connection to the line-side and load-side circuitry 354, 356. The terminals $T_{1F}$ and $T_{2F}$ of the fuse 352 are configured to structurally mate with the terminals $T_{1H}$ and $T_{2H}$ of the fuse holder or fuse block 552 such that an electrical connection between the line-side and load-side circuitry is established through the fuse element.

Unlike the system 500 (FIG. 14), the circuitry 360 is not provided in the housing 502 of the fuse 352, but is instead provided on or in the housing 554 of the fuse holder or fuse block 552. As such, the circuitry 360 in this embodiment is embedded in the fuse block 552 instead of in the fuse 352. The operation of the circuitry 360, however, remains the same, and the label 506 and reader 508 may also be provided as described above with similar effect to provide the fatigue assessment using the above-described techniques.

In an alternative embodiment wherein the circuitry 360 is embedded in the fuse 352 as described above in the system 500, the reader 508 could be embedded in the fuse block or housing 552.

The fuse holder or fuse block housing 554 may be provided with multiple sets of terminals $T_{1H}$ and $T_{2H}$ such that multiple sets of fuses 352 can be accommodated in the fuse housing or fuse block 552. The housing 554 may be provided in a single piece or in multiple pieces, and may be provided in modular pieces that may be attached to one another. The housing 554 may be configured as an open-style fuse block or may partly or completely enclose the fuse(s) 352 as desired.

The terminals $T_{1H}$ and $T_{2H}$ provided on the housing 554 may include resilient spring clips that are structurally configured to receive and retain the terminals $T_{1F}$ and $T_{2F}$ of the fuse 352. The fuse terminals $T_{1F}$ and $T_{2F}$ may be provided in any shape and structural configuration, including but not necessarily limited to end caps or ferrules, knife blade contacts, or terminal blades. The terminals $T_{1H}$ and $T_{2H}$ on the fuse holder or fuse block housing may accordingly be varied to mate with the terminals $T_{1F}$ and $T_{2F}$ of the fuse 352. Fuse rejection features may be built-in to the terminals $T_{1F}$ and $T_{2F}$ of the fuse 352 and/or may be incorporated into the housing 554 to prevent installation of an incompatible fuse.

The terminals $T_{1H}$ and $T_{2H}$ provided on the housing 554 also include terminal features such as box lugs, spring clamps, or other terminals configured to accept and retain an end of a wire utilized to establish the line and load-side electrical connections to the fuse block or housing 552. Alternatively, panel mount clips and the like, as well as another terminal structure to establish mechanical and electrical connection to the line and load circuitry 354, 356 may be provided.

Figure 16:
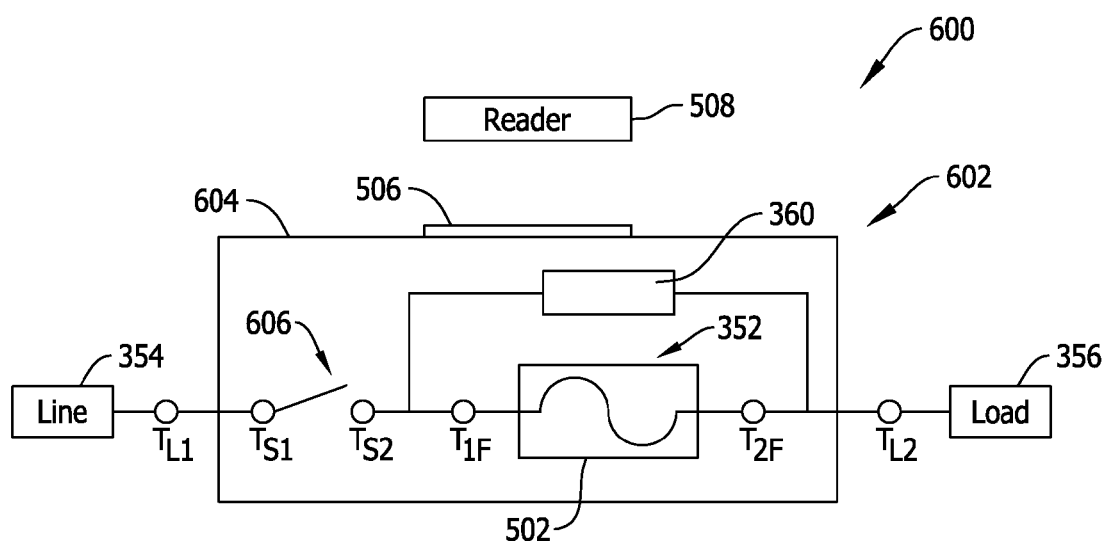
FIG. 16 schematically represents a third exemplary fuse fatigue evaluation system according to an embodiment of the present invention.

FIG. 16 schematically represents a third exemplary fuse fatigue evaluation system 600 according to an embodiment of the present invention. The system 600 includes a fusible disconnect switch device 602 including a housing or base 604 provided with terminals $T_{1L}$ and $T_{2L}$ respectively configured to structurally establish electrical connection to the line-side and load-side circuitry 354, 356. A switch 606 is provided in the housing or base 604 that may be selectively opened or closed to make or break the current path through the disconnect switch device 602, and when the fuse 352 is installed and the switch 606 is closed, the fuse element in the fuse 352 completes an electrical connection between the line and load-side circuitry 354, 356. The base 604 may in some embodiments be configured as a Compact Circuit Protector (CCP) of Bussmann by Eaton, St. Louis, Mo. As can be seen in the schematic of FIG. 15, the disconnect switch device 602 does not include an in-line circuit breaker and is accordingly smaller than conventional in-line circuit breaker and fuse combinations.

The terminals $T_{1F}$ and $T_{2F}$ of the fuse 352 are configured to structurally mate with complementary terminals of the base 604 such that an electrical connection may be established through the fuse element in the fuse 352. The complementary terminals of the base 604 may include resilient spring clips that are structurally configured to receive and retain the terminals $T_{1F}$ and $T_{2F}$ of the fuse 352. The fuse terminals $T_{1F}$ and $T_{2F}$ may be provided in any shape and structural configuration, including but not necessarily limited to end caps or ferrules, knife blade contacts, or terminal blades. The complementary terminals on the fuse holder or fuse block housing may accordingly be varied to mate with the terminals $T_{1F}$ and $T_{2F}$ of the fuse 352. Fuse rejection features may be built-in to the terminals $T_{1F}$ and $T_{2F}$ of the fuse 352 and/or may be incorporated into the housing 604 to prevent installation of an incompatible fuse. When the fuse 352 is installed, the switch 606 may be operated to connect or disconnect the electrical connection through the fuse element and between the line-side and load-side circuitry 354, 356. As such, the switch 606 provides a connection and disconnection of the circuit path through the device 602 while the fuse 352 remains in place.

In the embodiment shown in FIG. 16, the circuitry 360 is not provided in the housing 502 of the fuse 352, but is instead provided on or in the base 604 of the switch disconnect device 602. As such, the circuitry 360 in this embodiment is embedded in the base 602 instead of in the fuse 352. The operation of the circuitry 360, however, remains the same, and the label 506 and reader 508 may also be provided as described above with similar effect.

In an alternative embodiment wherein the circuitry 360 is embedded in the fuse 352 as described above in the system 500, the reader 504 could be embedded in the base 604.

The base 604 may be provided with multiple sets of terminals such that multiple sets of fuses 352 can be accommodated. The base 604 may be provided in a single piece or in multiple pieces, and may be provided in modular pieces that may be attached to one another. The base 604 may partly or completely enclose the fuse(s) 352 as desired.

Terminals $T_{1L}$ and $T_{2L}$ provided on the base 604 also include terminal features such as box lugs, spring clamps, or other terminals configured to accept and retain an end of a wire utilized to establish the line and load-side electrical connections to the disconnect switch device 602. Alternatively, panel mount clips and the like, as well as another terminal structure to establish mechanical and electrical connection to the line and load circuitry 354, 356 may be provided.

Figure 17:
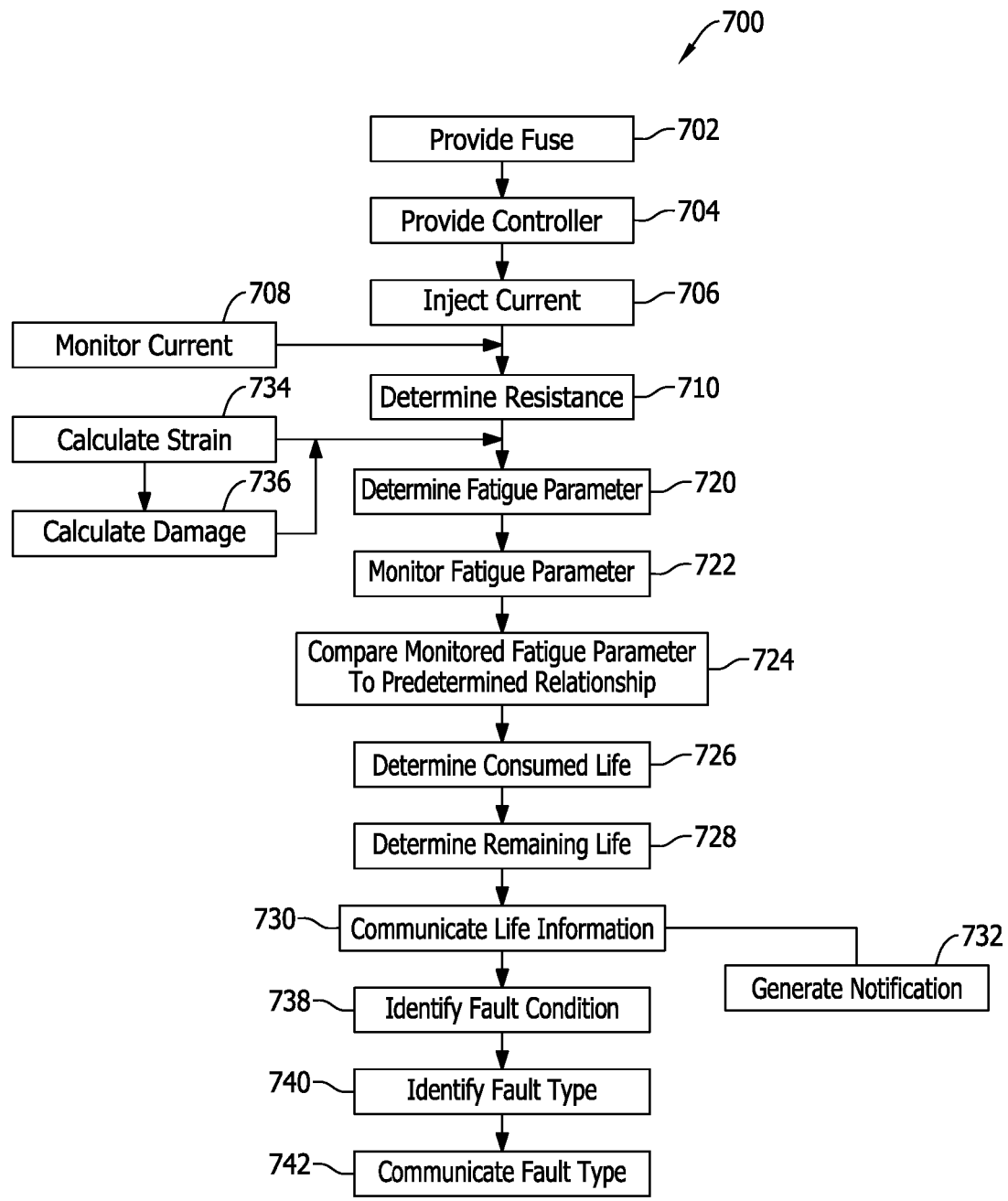
FIG. 17 is a method flowchart illustrating exemplary processes associated with the fuse fatigue evaluation techniques and systems shown in FIGS. 7-15.

FIG. 17 is a method flowchart illustrating exemplary processes 700 associated with the fuse fatigue evaluation techniques and systems shown in FIGS. 7-15. The processes 700 may be performed electronically to implement an electrical fuse fatigue assessment system such as those described above or still further variations as appropriate or as described to flexible meet particular needs of different electrical power systems. While the processes 700 may be particularly desirable in EV power system applications described above, they are not limited to EV power system applications and instead may be extended to any power system wherein fuse fatigue and the problems discussed above are of practical concern.

As shown in the preparatory steps in FIG. 17, a fuse is provided at step 702 and a controller is provided at step 704. As described above, the fuse provided at step 702 may include one or more stamped metal fuse elements that define a geometry including at least one weak spot, and the controller provided at step 704 may include the controllers described above. In contemplated embodiments, the controller may be built-in to the fuse, and as such the steps 702 and 704 may be implemented in a single step rather than in separate steps. In other contemplated embodiments, the controller may be built-in to a fuse holder or a disconnect switch and as such step 704 may include providing the fuse holder or a disconnect switch including the controller. In still other embodiments, however, the controller provided at step 704 may be provided in another manner that facilitates facilitate evaluation. In embodiments including more than one controller as contemplated above, additional steps similar the step 704 would be appropriately performed. When so provided, the controller or controllers supplied may monitor at least one fuse fatigue parameter over a period of time while the fuse provided at step 702 is connected to an energized electrical power system.

As represented at step 706 a current source may be provided and a current may be injected by the controller. Compensation circuitry such as that described above as that described above may be provided internal or external to the fuse and may be configured to detect current flow through the fuse. Using techniques such as those described above, the controller may be configured to measure a resistance of the fuse element based on the injected current across the fuse element from the current source. In some cases, an optional separate current sensor (or current sensors) represented at step 708 may also be utilized to facilitate resistance measurements or otherwise provide some ability to assess fuse element fatigue issues. As such current injection techniques and compensation circuitry are not necessarily required in all embodiments.

As shown at step 720, the controller is configured to determine the resistance of the fuse element in the fuse provided at step 702. Such resistance can be monitored over time to determine changes in resistance that may indicate advancement of fuse fatigue using the techniques described above.

In a contemplated embodiment, the measured resistance is utilized as a fuse fatigue parameter that is monitored over a period of time as shown at step 722 to assess a state or condition of fuse element fatigue. Specifically, and as described above, in some embodiments the measured change in resistance may be compared to a predetermined fuse fatigue resistance plot by the controller as represented by step 724. Based on the monitored fuse fatigue parameter (e.g., change in monitored resistance), the controller is further configured to determine at least one of a consumed service life of the fuse element as shown at step 726 or a service life remaining of the fuse element as shown at step 728.

Once the consumed service life and/or service life remaining is determined, the controller may communicate information regarding the at least one of a consumed service life of the fuse element or service life remaining of the fuse element as shown at step 730. The communication of the life information may be communicated in any manner such as those described above or known in the art. While wireless communication may be preferred in certain systems, wired communication may be preferred in others, and in some systems both wireless and wired communications could be utilized to provide redundant communication modalities. The life information communicated may, as described above, be communicated from one controller to another (or from one device to another) before being received at an appropriate destination wherein alerts or notifications can be generated as shown at step 732 to avoid nuisance-type operation of the fuse due to fatigue issues. In particular, the communication of the information may include a reader device or a remote device in communication with the controller. In embodiments having multiple controllers, the controllers may determine or communicate only a portion of the information to another controller or device that may further process the information received until eventually the life information is available for communication at step 730 for the ultimate purpose of notification at step 732 as the fuse element approaches its end of life. Before such notification is appropriately generated, the life information may be recorded and communicated as well to facilitate data archival and analysis functionality, as well as desired reports.

After the notification 732 is generated, some lead time may be afforded so that the fuse can be proactively replaced before the fuse element fails due to advanced fuse fatigue to ensure that the use and enjoyment of the power system is not interrupted. In applications such as in the EV power system applications discussed, system reliability and user satisfaction can be enhanced by avoiding an otherwise unpredictable nuisance-type operation of the fuse attributable to fuse fatigue.

In another exemplary process, the controller may optionally be configured to calculate a strain associated with the current flowing through the fuse as shown at step 734. The calculated strain may be utilized as the fuse fatigue parameter for purposes of steps 720, 722 and 724. At step 724, the controller may compare the calculated strain to a predetermined fuse fatigue strain plot as discussed above to determine the at least one of a consumed service life of the fuse element or a service life remaining of the fuse element as shown at steps 726 and 728.

In another exemplary process, the controller may optionally calculate a fatigue damage component based on a detected number of current peaks in a predetermined range and a total number of cycles to failure at the calculated strain as shown at step 736. Such calculation may or may not relate to the calculated strain of step 734. Regardless, the fatigue damage component may be utilized as the fuse fatigue parameter for purposes of steps 720, 722 and 724. At step 724, the controller may compare accumulated fatigue damage components and compare the accumulated fatigue to 1 to determine the at least one of a consumed service life of the fuse element or a service life remaining of the fuse element as shown at steps 726 and 728.

As such, fuse fatigue parameters such as change in resistance, a change in mechanical strain of the fuse element, and an accumulated damage component may be monitored separately or in combination in the same or different embodiments to provide a variety of different fuse fatigue evaluation systems. In embodiments wherein more than one fuse fatigue parameter is monitored, the results can be compared to provide system redundancy and/or to allow more advanced system functionality such as system error detection capabilities and the like. More than one type of fuse fatigue assessment based on the different fuse fatigue parameters likewise be communicated at step 730.

As shown at step 738, the controller may be configured to identify a fault condition. At step 740, the controller may also be configured to identify a specific type of fault current in the electrical power system using techniques such as those described above (e.g., fault identification based on an assessment window of a predetermined duration based on an assessment window of a predetermined duration). At step 742, the controller may be configured to communicate the type of fault current. Such communication of specific types of fault currents may be valuable to troubleshoot or optimize electrical power systems over time, as well as to provide real-time feedback concerning the performance of electrical fuses in an electrical power system.

The processes shown and described may be scaled over a number of fuses in a desired electrical power system such that multiple fuses can be simultaneously monitored for fuse fatigue issues. Individual variations in fuse performance can be identified and detected by comparing fatigue information from one fuse against other fuses that may be subjected to the same or different current profiles. Information collected and communicated for a number of fuses in an energized power system may provide valuable real-time feedback for the purposes of troubleshooting or optimizing electrical power systems over time, as well as to analyze and optimize performance of electrical fuses in the electrical power system.

Having now described the exemplary systems 300, 500, 550 and 600 in the functional aspects, those in the art may construct control circuitry to implement the methodology and processes of the controls as described without further explanation. Any programming of a controller may be accomplished using appropriate algorithms and the like to provide the desired effects, which is believed to be within the purview of those in the art.

The benefits of the invention are now believed to have been amply illustrated in relation to the exemplary embodiments disclosed.

An embodiment of an electrical fuse fatigue assessment system has been disclosed including: a controller configured to monitor at least one fuse fatigue parameter over a period of time while the fuse is connected to an energized electrical power system. Based on the monitored at least one fuse fatigue parameter, the controller is further configured to determine at least one of a consumed service life of the fuse element or a service life remaining of the fuse element.

Optionally, the at least one fuse fatigue parameter may include one of a change in resistance, a change in mechanical strain of the fuse element, or an accumulated damage component.

The system may include a current source, wherein the controller is configured to measure a resistance of the fuse based on an injected current across the fuse element from the current source. The controller may be configured to compare the measured resistance to a predetermined fuse fatigue resistance plot. The system may include compensation circuitry configured to detect current flow through the fuse.

The controller may optionally be configured to calculate a strain associated with the current flowing through the fuse. The controller may be configured to compare the calculated strain to a predetermined fuse fatigue strain plot.

The controller may optionally be configured to calculate a fatigue damage component based on a detected number of current peaks in a predetermined range and a total number of cycles to failure at the calculated strain. The controller may be configured to accumulate the calculated fatigue damage components and compare the accumulated fatigue to 1 to determine the at least one of a consumed service life of the fuse element or a service life remaining of the fuse element.

The controller may optionally be configured to communicate information regarding the at least one of a consumed service life of the fuse element or service life remaining of the fuse element. The controller may be configured to wirelessly communicate the information.

The controller may optionally be configured to identify a type of fault current in the electrical power system. The controller may be configured to communicate the type of fault current. The controller may be configured to wirelessly communicate the type of fault. The controller may be configured to identify the fault current based on an assessment window of a predetermined duration.

As different options, the controller may be built-in to the fuse, may be is built-in to a fuse holder, or may be built-in to a disconnect switch. The system may likewise at least one of a reader device or a remote device in communication with the controller.

The fuse element may be a metal fuse element stamped into a geometry including at least one weak spot.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An electrical fuse fatigue assessment system comprising:
    a controller monitoring a fuse fatigue parameter of an electrical fuse over a period of time while the electrical fuse is connected to an energized electrical power system; and
    a circuit connected in electrical parallel with the electrical fuse, the circuit including a current source injecting current across the electrical fuse;
    wherein the controller measures a resistance of the electrical fuse based on the injected current across the electrical fuse;
    wherein the controller assesses the monitored fuse fatigue parameter in reference to the measured resistance; and
    wherein, based on the assessed monitored fuse fatigue parameter, the controller determines at least one of a consumed service life of the electrical fuse or a service life remaining of the electrical fuse.

2. The system of claim 1, wherein the assessed monitored fuse fatigue parameter includes a change in measured resistance, a change in mechanical strain, or an accumulated damage component.

3. The system of claim 1, wherein the current source injects an AC current at a preset frequency across the electrical fuse.

4. The system of claim 3, wherein the controller compares the measured resistance to a predetermined fuse fatigue resistance plot for the electrical fuse.

5. The system of claim 1, wherein the controller, using the measured resistance, calculates a current flowing through the electrical fuse; and
    wherein the controller further calculates a strain associated with the current flowing through the electrical fuse.

6. The system of claim 5, wherein the controller compares the calculated strain to a predetermined fuse fatigue strain plot for the electrical fuse.

7. The system of claim 1, wherein the controller, using the measured resistance, calculates a current flowing through the electrical fuse; and
    wherein the controller further calculates a fatigue damage component based on a detected number of current peaks in a predetermined range and a total number of cycles to failure at the calculated strain.

8. The system of claim 7, wherein the controller further accumulates the calculated fatigue damage components over time; and
    wherein the controller further compares the accumulated calculated fatigue damage components to 1 to determine the at least one of a consumed service life of the electrical fuse or a service life remaining of the electrical fuse.

9. The system of claim 1, wherein the controller communicates information regarding the at least one of a consumed service life of the electrical fuse or the service life remaining of the electrical fuse.

10. The system of claim 9, wherein the controller wirelessly communicates the information.

11. The system of claim 1, wherein the controller identifies a type of fault current in the energized electrical power system.

12. The system of claim 11, wherein the controller communicates the identified type of fault current.

13. The system of claim 12 wherein the controller wirelessly communicates the identified type of fault current.

14. The system of claim 11, wherein the controller identifies the fault current based on an assessment window of a predetermined duration.

15. The system of claim 1, wherein the controller is built-in to the electrical fuse.

16. The system of claim 1, wherein the controller is built-in to a fuse holder.

17. The system of claim 1, wherein the controller is built-in to a disconnect switch.

18. The system of claim 1, further comprising at least one of a reader device or a remote device in communication with the controller.

19. The system of claim 1, wherein the electrical fuse includes a metal fuse element stamped into a geometry including at least one weak spot.

* * * * *